United States Patent [19]

Frazier, Jr.

[11] 4,103,234
[45] Jul. 25, 1978

[54] SYSTEM FOR TRANSMISSION STORAGE AND/OR MULTIPLEXING OF INFORMATION

[75] Inventor: William R. Frazier, Jr., Indialantic, Fla.

[73] Assignee: General Dynamics Corp., St. Louis, Mo.

[21] Appl. No.: 111,919

[22] Filed: Feb. 2, 1971

Related U.S. Application Data

[62] Division of Ser. No. 685,353, Nov. 24, 1967, Pat. No. 3,588,836.

[51] Int. Cl.² .............................................. H04B 1/00
[52] U.S. Cl. .......................... 325/38 A; 340/347 DD; 340/347 AD
[58] Field of Search .................... 235/154; 325/38–44, 325/141, 321, 322; 340/347, 360; 178/66–68, 69.5, 8

[56] References Cited

U.S. PATENT DOCUMENTS

| 2,700,696 | 1/1955 | Barker | 325/38 X |
| 2,996,578 | 8/1961 | Andrews, Jr. | 325/38 |
| 3,133,280 | 5/1964 | Crater | 325/38 X |
| 3,230,310 | 1/1966 | Brogle, Jr. | 325/38 X |
| 3,303,424 | 2/1967 | Hopner et al. | 178/69.5 X |
| 3,378,770 | 4/1968 | Daguet | 325/38 |
| 3,388,330 | 6/1968 | Kretzmer | 325/42 |
| 3,423,529 | 1/1969 | O'Neill, Jr. | 178/68 |
| 3,518,662 | 6/1970 | Nakagome, et al. | 325/38 X |

Primary Examiner—Charles D. Miller
Attorney, Agent, or Firm—Martin Lu Kacher

[57] ABSTRACT

A system is described for transmission, storage (as by recording) and for multiplexing of both digital and analog information. The recording system includes apparatus for converting analog information into digital information having a predetermined format. Each track of the recording apparatus receives a series of encoded format words containing a plurality of ternary NRZ pulses, each represented by any one of three voltage levels; positive, negative or zero volts during a bit interval, such that the average level of each word is zero volts. The spectrum of a signal composed of a serial sequence of these format words is capable of being recorded on a magnetic tape recording track with a much higher pulse packing density than heretofore possible with conventional NRZ or other binary recording techniques. The playback apparatus which forms part of the recording system includes circuitry responsive to the zero average property of the recorded words, and controls the timing of the readout of the recorded information so as to provide precise time coherence between all of the recorded channels. The latter circuitry also controls the system for deskewing the signals recorded simultaneously on parallel tracks on the tape during playback, thereby further enhancing the capability of this system to record information with extremely high pulse packing density. Both recording and playback is controlled by a common accurate clock so as to further insure coherence between signals recorded on all channels. Also included in the recording system is an input/output section which translates input analog information into digital form for recording in the various channels at rates and with the format compatible for recording with the system. The input/output section also rearranges the digital information read from the magnetic record into its original analog or digital form, as the case may be.

19 Claims, 14 Drawing Figures

FIG. 5.

| DECIMAL | BINARY WORD A B C D | TERNARY VOLTAGE WORD W X Y Z | | DECODER SUM | \multicolumn{18}{c}{DECODER OUTPUT FOR DECIMAL WORD} |
|---|---|---|---|---|---|---|---|---|---|---|---|---|---|---|---|---|---|---|---|---|---|
| | | | | | 1 | 2 | 3 | 4 | 5 | 6 | 7 | 8 | 9 | 10 | 11 | 12 | 13 | 14 | 15 | 16 | 17 | 18 |
| 0 | 0 0 0 0 | + + − − | S₁ | v₁ +v₂ −v₃ −v₄ | (+4) | ±2 | ±2 | 0 | 0 | 0 | 0 | ±2 | ±2 | 0 | 0 | 0 | 0 | 0 | 0 | 0 | −2 | 0 |
| 1 | 0 0 0 1 | + 0 0 − | S₂ | 2v₁ −|v₂|−|v₃|−2v₄ | 0 | (+4) | +1 | ±2 | +1 | −2 | −3 | −2 | +1 | −3 | −2 | −3 | −2 | −3 | −6 | −4 | −4 | −6 |
| 2 | 0 0 1 0 | + 0 − 0 | S₃ | 2v₁ −|v₂|−2v₃−|v₄| | ±2 | +1 | (+4) | −2 | +1 | ±2 | −3 | −2 | +1 | −3 | +1 | −3 | −2 | −6 | −3 | −2 | −3 | −6 |
| 3 | 0 0 1 1 | + − + − | S₄ | v₁ −v₂ +v₃ −v₄ | 0 | ±2 | 0 | (+4) | ±2 | 0 | 0 | −2 | ±2 | ±2 | ±2 | 0 | 0 | 0 | −4 | 0 | −2 | 0 |
| 4 | 0 1 0 0 | + − 0 0 | S₅ | 2v₁ −2v₂ −|v₃|−|v₄| | −2 | +1 | +1 | ±2 | (+4) | ±2 | −3 | −3 | −2 | −2 | ±2 | +1 | +1 | −2 | −4 | −2 | −3 | −2 |
| 5 | 0 1 0 1 | + − − 0 | S₆ | v₁ −v₂ −v₃ +v₄ | 0 | 0 | ±2 | 0 | ±2 | (+4) | ±2 | 0 | −2 | 0 | −2 | 0 | ±2 | −2 | 0 | −2 | 0 | 0 |
| 6 | 0 1 1 0 | 0 + 0 − | S₇ | −|v₁|+2v₂ −|v₃|−2v₄ | ±2 | +1 | −2 | −2 | −3 | −6 | (+4) | +1 | +1 | −3 | −3 | 0 | ±2 | −2 | −2 | −2 | −3 | −6 |
| 7 | 0 1 1 1 | 0 + − 0 | S₈ | −|v₁|+2v₂ −2v₃ −|v₄| | ±2 | −2 | +1 | −6 | −3 | −2 | +1 | (+4) | +1 | −3 | −4 | −3 | −2 | +1 | −2 | −3 | −2 | −6 |
| 8 | 1 0 0 0 | 0 0 + − | S₉ | −|v₁|−|v₂|+2v₃ −2v₄ | −2 | +1 | −3 | ±2 | −2 | −6 | −3 | −3 | (+4) | −4 | −3 | −2 | −6 | −2 | −2 | −6 | +1 | −2 |
| 9 | 1 0 0 1 | 0 0 − + | S₁₀ | −|v₁|−|v₂|−2v₃ +2v₄ | −2 | −3 | +1 | ±2 | ±2 | −2 | −3 | +1 | −4 | (+4) | −3 | +1 | −2 | −2 | −3 | −6 | +1 | −2 |
| 10 | 1 0 1 0 | 0 − 0 + | S₁₁ | −|v₁|+2v₂ +2v₃ −|v₄| | −6 | −2 | −3 | −2 | −2 | ±2 | +1 | +1 | −3 | −3 | (+4) | +1 | +1 | −3 | −2 | −2 | −2 | ±2 |
| 11 | 1 0 1 1 | 0 − + 0 | S₁₂ | −|v₁|−|v₂|−2v₃ +2v₄ | −6 | −3 | −2 | −2 | ±2 | −3 | −2 | −4 | −3 | −3 | +1 | (+4) | −3 | −3 | −2 | −2 | +1 | ±2 |
| 12 | 1 1 0 0 | − + + 0 | S₁₃ | −v₁ +v₂ +v₃ −v₄ | 0 | 0 | 0 | 0 | −2 | −4 | −6 | −3 | ±2 | +1 | ±2 | 0 | (+4) | ±2 | 0 | ±2 | 0 | 0 |
| 13 | 1 1 0 1 | − + 0 0 | S₁₄ | −2v₁ +2v₂ −|v₃|−|v₄| | −2 | −3 | −3 | −6 | −4 | −6 | 0 | −3 | −2 | −2 | −3 | −3 | ±2 | (+4) | ±2 | +1 | +1 | −2 |
| 14 | 1 1 1 0 | − 0 + 0 | S₁₅ | −v₁ +v₂ +v₃ +v₄ | 0 | −2 | 0 | −4 | −2 | 0 | 0 | −4 | −2 | −2 | 0 | 0 | 0 | ±2 | (+4) | 0 | ±2 | 0 |
| 15 | 1 1 1 1 | − 0 0 + | S₁₆ | −2v₁ −|v₂|−|v₃|−v₄ | −6 | −3 | −4 | −2 | −3 | −6 | −2 | −3 | +1 | −3 | +1 | −2 | ±2 | +1 | −2 | (+4) | +1 | 0 |
| FRAME SYNC | | − 0 0 + | S₁₇ | −2v₁ −|v₂|−|v₃|+2v₄ | −6 | −4 | −3 | −6 | −3 | −2 | −3 | −4 | −3 | +1 | −2 | −3 | −2 | +1 | −2 | +1 | (+4) | ±2 |
| 0 | 0 0 0 0 | − − + + | S₁₈ | −v₁ −v₂ +v₃ +v₄ | 0 | −2 | −2 | 0 | 0 | 0 | 0 | −2 | −2 | 0 | 0 | 0 | 0 | 0 | 0 | ±2 | ±2 | (+4) |

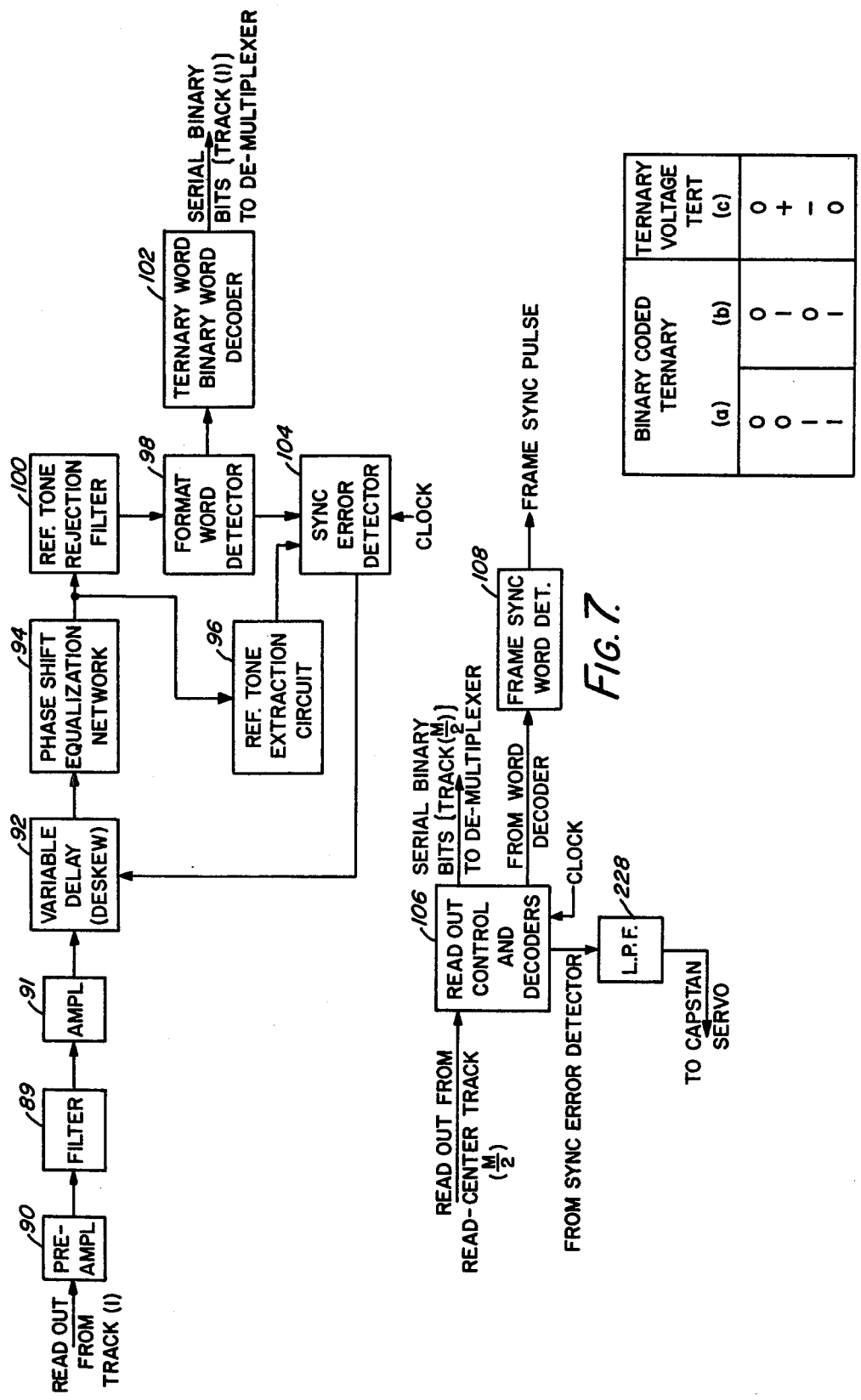

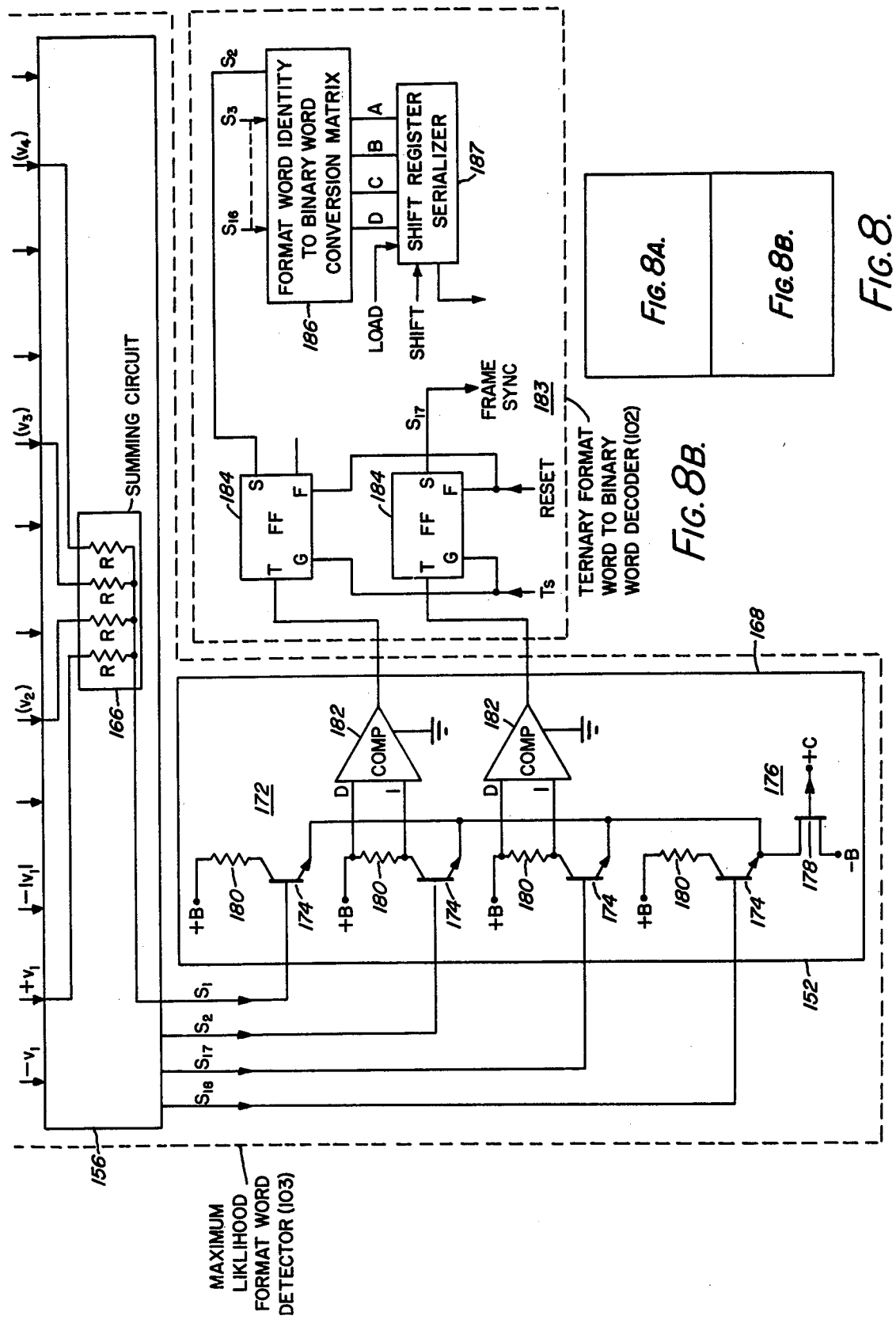

SYSTEM FOR TRANSMISSION STORAGE AND/OR MULTIPLEXING OF INFORMATION

This application is a division of my patent application Ser. No. 685,353, filed Nov. 24, 1967, now U.S. Pat. No. 3,588,836.

The present invention relates to methods and apparatus for magnetic recording and reproduction and particularly to multi-channel information recording systems.

The invention is especially suitable for use in a coherent multi-channel data recording system using magnetic tape as the recording medium and having very high data storage capacity. The invention, however, has application to other analog and digital communications systems and to other information processing systems and circuits.

There are numerous applications for high capacity phase-coherent multi-channel recording systems, both for digital and analog systems. In general, each application has different input/output requirements, such as in the case of analog information, the number of analog input channels, their bandwidth, amplitude response and dynamic range requirements. Some analog recording systems also have requirements for recording digital information concurrently with the analog information. In the past, direct analog recording, FM/FM multiplex, and time division multiplex pulse amplitude modulated recording have been employed. These prior systems, however, usually lack the flexibility to handle a different set of input/output requirements from that for which they were specifically designed. The information storage capacity for such prior systems is also restricted. Storage capacity is lost in many of these systems in order to compensate for skew and other timing errors in recording and reproduction of the parallel tracks. Many systems of recording are not able to adequately handle signals of wide dynamic range. Still others have poor error performance. It is therefore desirable to provide a high capacity reformatable (viz. variable number and type of input/output channels) recording system having capacity to handle analog signals of wide dynamic range with desired degrees of precision (signal resolution). This recording system should also be capable of handling digital information alone or interspersed with analog information.

Accordingly, it is a principal object of the present invention to provide improved methods of recording and reproducing both analog and digital information.

It is a further object of the invention to provide an improved recording system having the capacity to store more information per unit of record medium than prior recording systems.

It is a still further object of the present invention to provide a recording system for recording information in digital form along a track on a record medium with a higher density in terms of bits or pulses per unit of track length than heretofore practicable.

It is a still further object of the present invention to provide an improved system for recording signals having a higher bandwidth signal-to-noise product than heretofore practicable.

It is a still further object of the present invention to provide an improved recording system capable of recording signals which vary in amplitude over a greater signal voltage range (viz. have a more extended dynamic range) than has been practicable with prior recording systems.

It is a still further object of the present invention to provide an improved recording system wherein signals which are recorded on and read out from a plurality of separate channels or tracks which extend across the recording medium in side-by-side relationship are brought into time coherence.

It is a still further object of the present invention to provide an improved recording system wherein skew or other time displacements between signals recorded on different tracks of a plurality of parallel tracks is readily eliminated.

It is a still further object of the present invention to provide a multi-channel recording system having greater flexibility with regard to formatting and otherwise handling signals, so as to accommodate their different characteristics, than is the case with prior recording systems.

It is a still further object of the present invention to provide an improved multi-channel data recording system having better error performance than prior systems.

It is a still further object of the present invention to provide an improved multi-channel recording system which provides readout in digital form so as to be directly utilizable by associated data handling devices, such as computers.

It is a still further object of the present invention to provide an improved recording system having a high signal noise response characteristic.

It is a still further object of the present invention to provide an improved data recording system wherein signals are recorded and read out of the recorder in coherence with an internal or external frequency standard signal.

It is a still further object of the present invention to provide an improved data recording system having variable data read-in and/or readout rates.

Briefly described, a multi-channel recording system embodying the invention includes a multi-track magnetic recorder. Analog signals are converted to digital form with the required resolution by analog-to-digital conversion means. These digital signals are then encoded into a plurality of multi-bit words for recording (each of which words may be termed a format word) on each of the plurality of tracks. Each format word has, when converted into pulses for recording, a zero-average level (viz. the average voltage level over the format word periods is zero). In addition, the encoding process translates the information contained in the format words into a form which contains redundant information, thereby improving the error performance of the overall system. In the event that digital information is directly available for recording, the digital information is coded into the above-mentioned word. Thus, the system is capable of simultaneously accepting both direct digital inputs and digitized analog signals. Sequencing logic may be provided for interspersing both the digitized analog signal and the digital signal inputs to the end that the information on playback may be decommutated into its original digital or analog form, or otherwise identified as to its analog or digital origin.

By virtue of the encoding and conversion process, the information spectrum of the format word sequences, which comprises the signal which is recorded on a track lies completely within a band related to the frequency response of the overall magnetic recording system, sometimes referred to herein as the recording/playback process. A filter may be used to process the signal prior to recording. This will enhance the utilization of the dynamic range capability of the recording/playback process and simultaneously insure that the spectral characteristic of the total signal is the inverse of the spectral characteristic of the recording apparatus, thereby improving the signal to-noise ratio of the overall recording system and producing output signals after playback which are identical to the input signals to facilitate word recognition. Such pre-emphasis over the information spectrum of the input signal is made possible by virtue of the matched spectral characteristics of the signal (matched to the recording system response) resulting from the zero average characteristics of the format words. Inasmuch as the spectral characteristic of the input to the system is matched to the spectral characteristic of the recording system and format words have redundant information, extremely high pulse packing densities may be achieved. For example, given a recorder having a 60 inch per second linear tape-to-head speed and a frequency response from 150 KHz to 1.2 MHz, information at a rate of 2.4 megabits per second can be recorded on a single track, since the information carrying frequency spectrum of the input signal lies completely within the three octave band extending from 1/16 to ⅛ of the bit rate. This corresponds to a recording density of 40,000 bits per inch.

An additional feature of the system is that a high resolution magnetic head may readily be used which is optimized to have its frequency response over the range compatible with the bit rate. Thus, the head need not have as many turns or require magnetic material which would otherwise be necessary to support the recording of low frequency information as is normally the case with digital recording heads.

The playback apparatus which forms a part of the recording system includes circuitry responsive to the zero average characteristic of the format word sequences recorded on the tape in order to obtain synchronization signals. The synchronization signals may be applied to a capstan speed control system in the recording apparatus for tape speed control without the need for an auxiliary clock track. Variable delay means in each channel are also responsive to the synchronization signal for controlling the timing of data readout from each track to achieve word synchronization for readout, say with reference to a common frequency standard in order to effectively deskew the signals reproduced from each channel recorded on the record medium. Since the synchronization signal is derived from each format word sequence, synchronization is precisely maintained in spite of tape jitter. Thus, the error performance of the recording system is enhanced and higher recording capacity or density is obtained.

The bits derived from each word sequence which are read out are also applied to a maximum likelihood decoder which makes use of the statistical properties of the zero average plural bit word to detect the value of the recorded bits in each word with the minimum likelihood of error.

The invention itself, both as to its organization and method of operation, as well as additional objects and advantages thereof will become more readily apparent from a reading of the following description in connection with the accompanying drawings in which:

FIG. 5 is a table in the nature of a truth table which depicts the operation of the encoder shown in FIG. 4 and of the maximum likelihood decoder shown in FIGS. 8A & B;

FIG. 6 is a truth table of the logic of part of the encoder;

FIG. 7 is a block diagram of the readout or playback portion of the recording system section shown in FIG. 1 which processes signals read out from the magnetic tape medium to decode the recorded information and to control the timing of the readout so as to synchronize and deskew the readout from parallel tracks;

Figure 1:
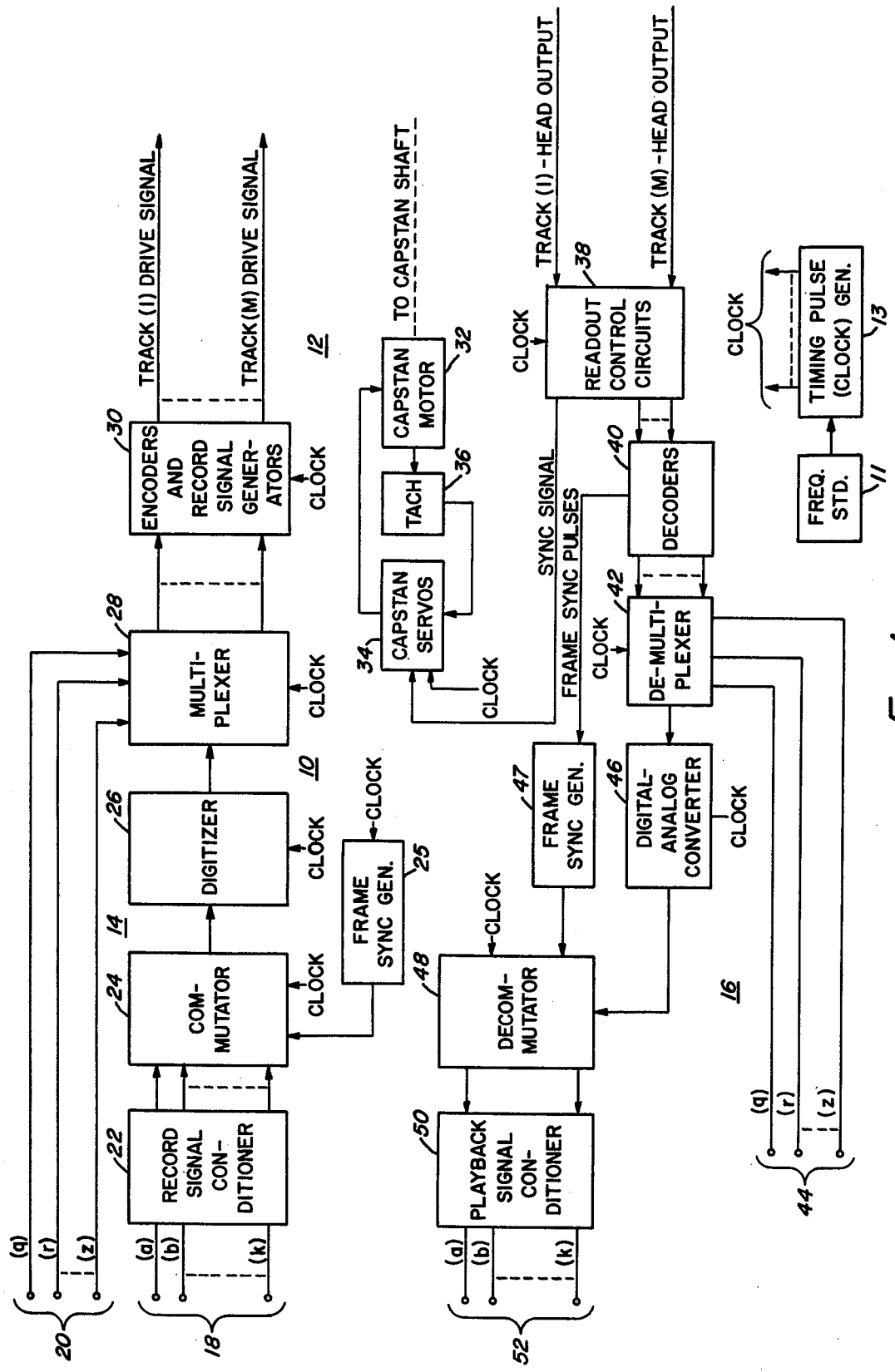
FIG. 1 is a block diagram of a magnetic tape recording system embodying the invention.
Figure 8A:
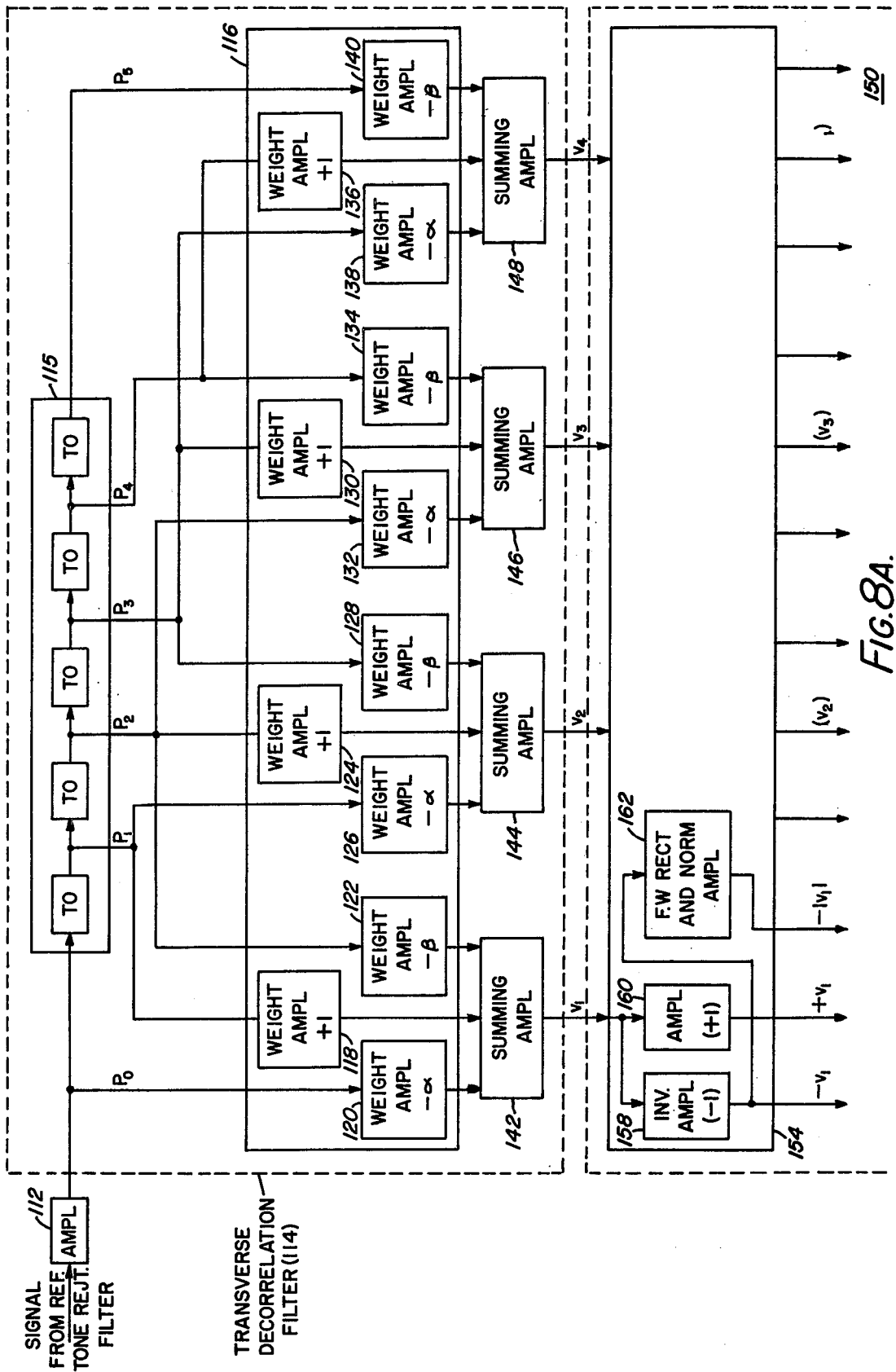
Figure 9:
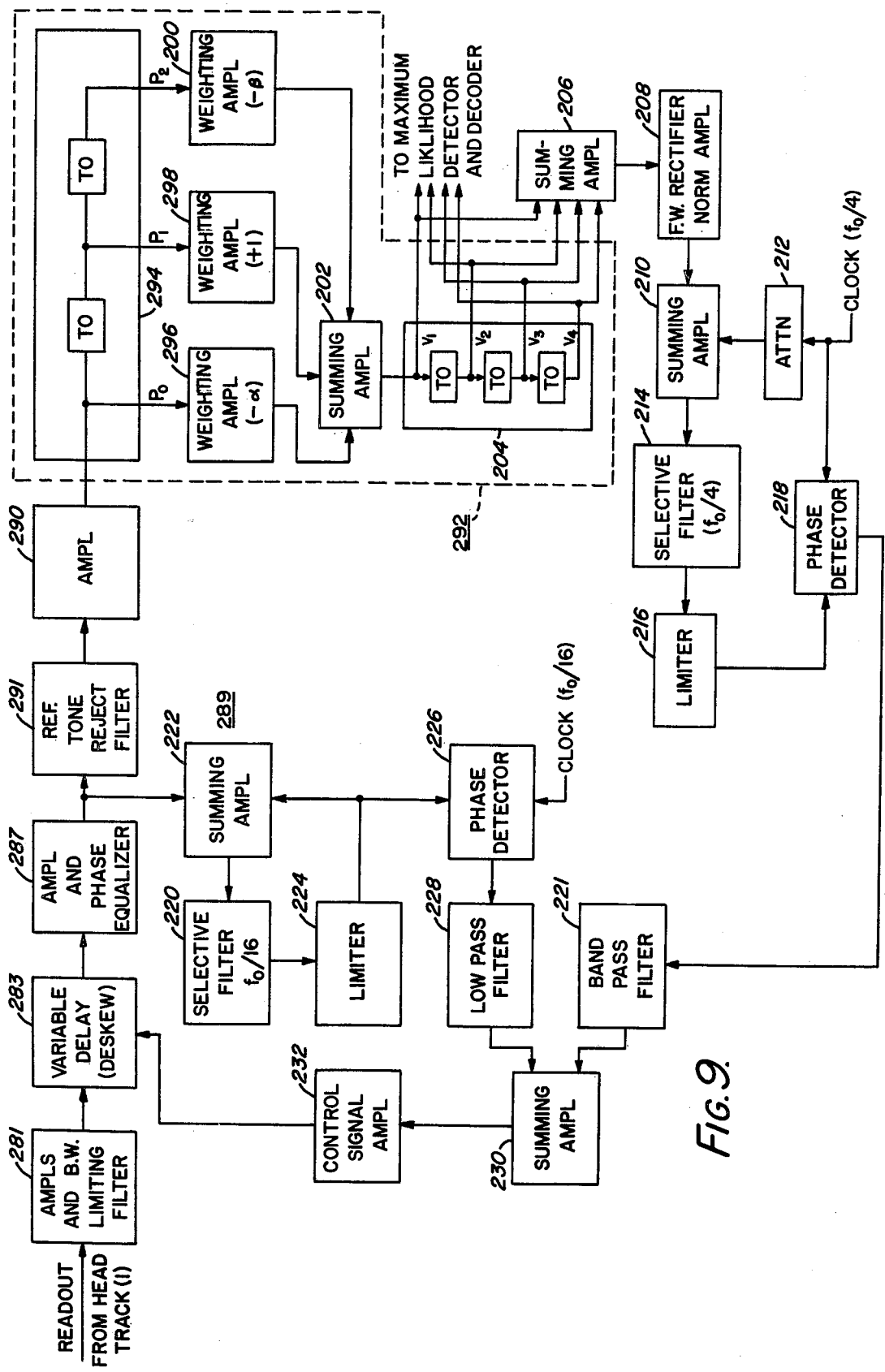
Figure 10:
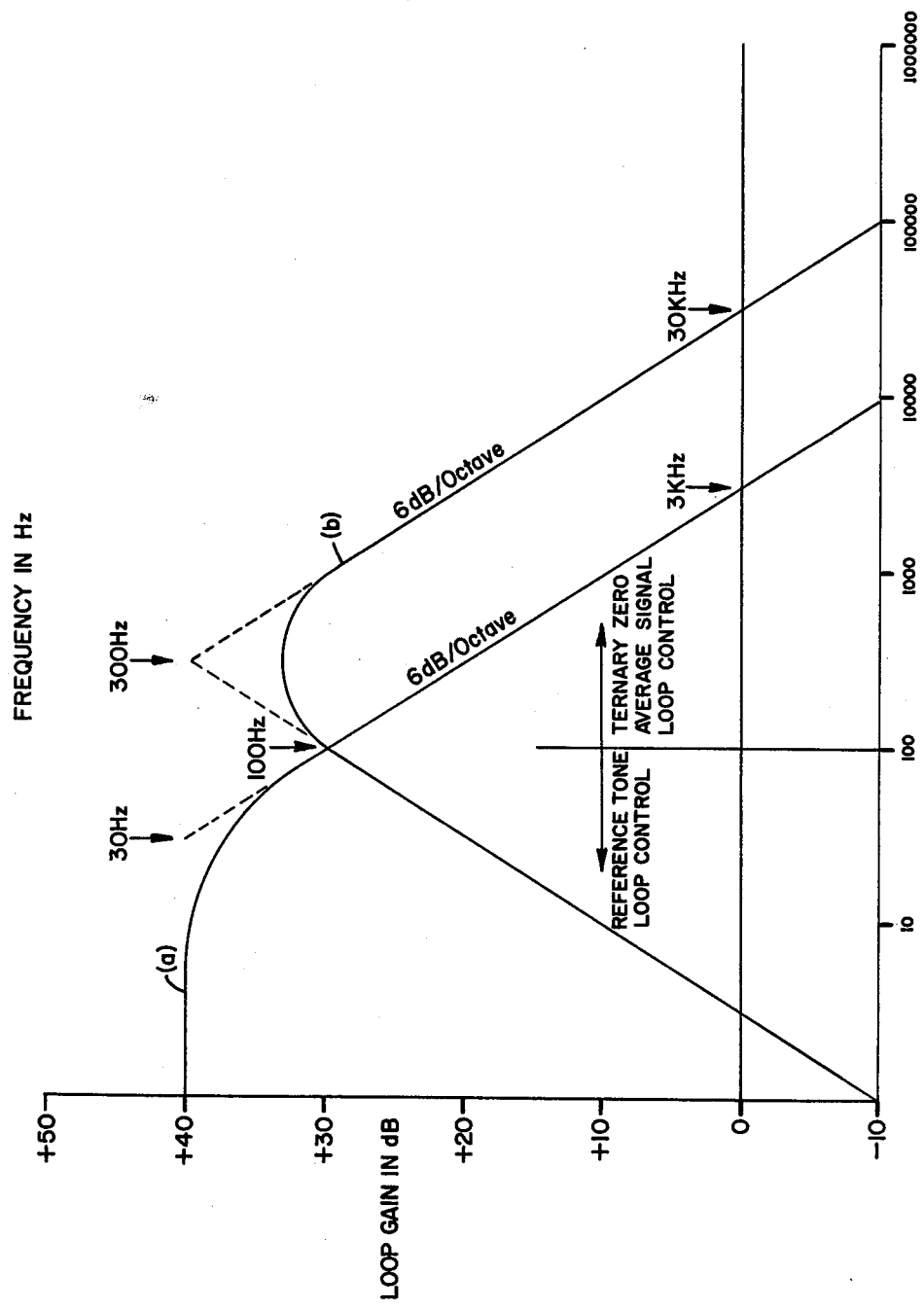
Figure 11:
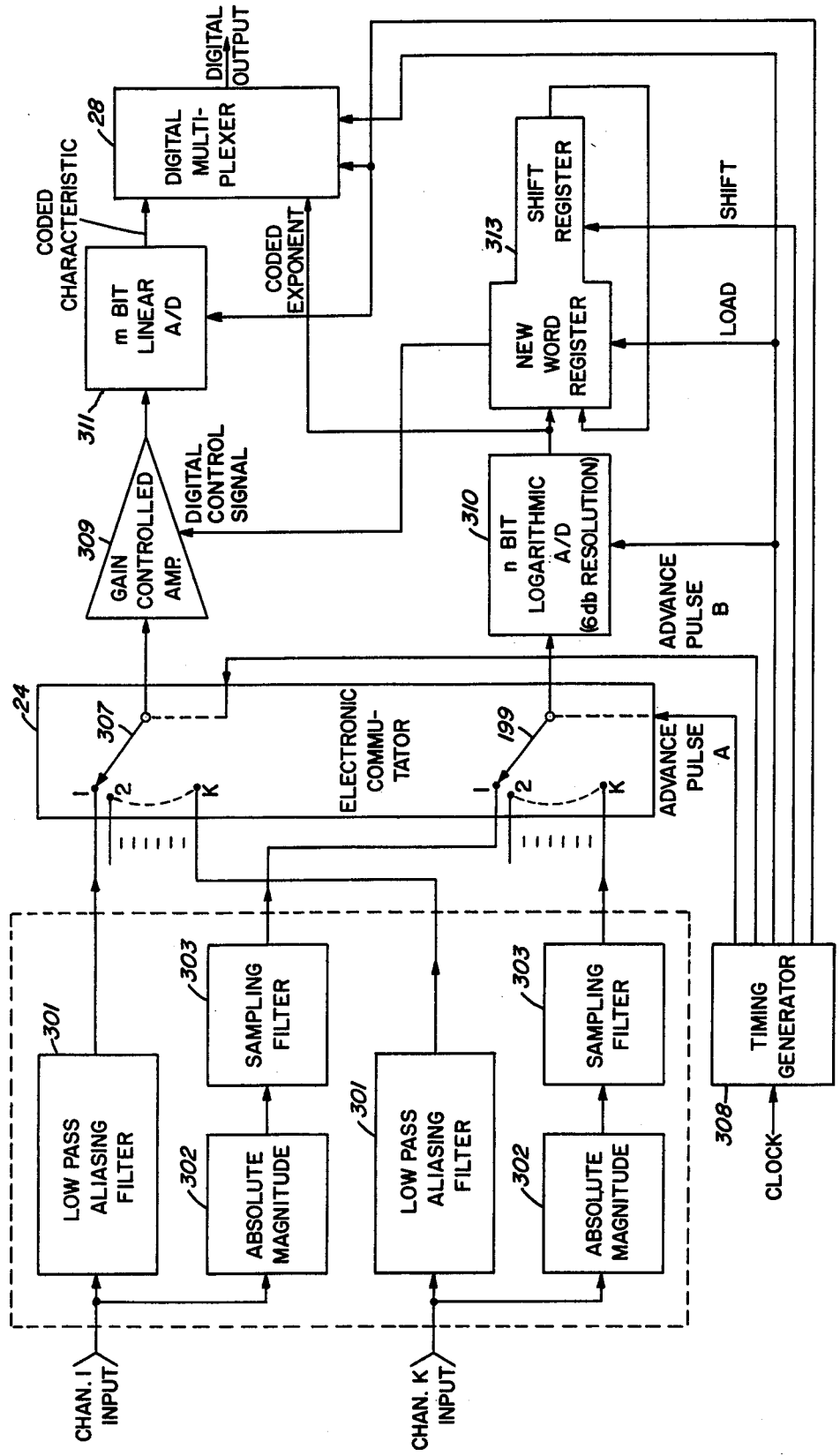
Figure 12:
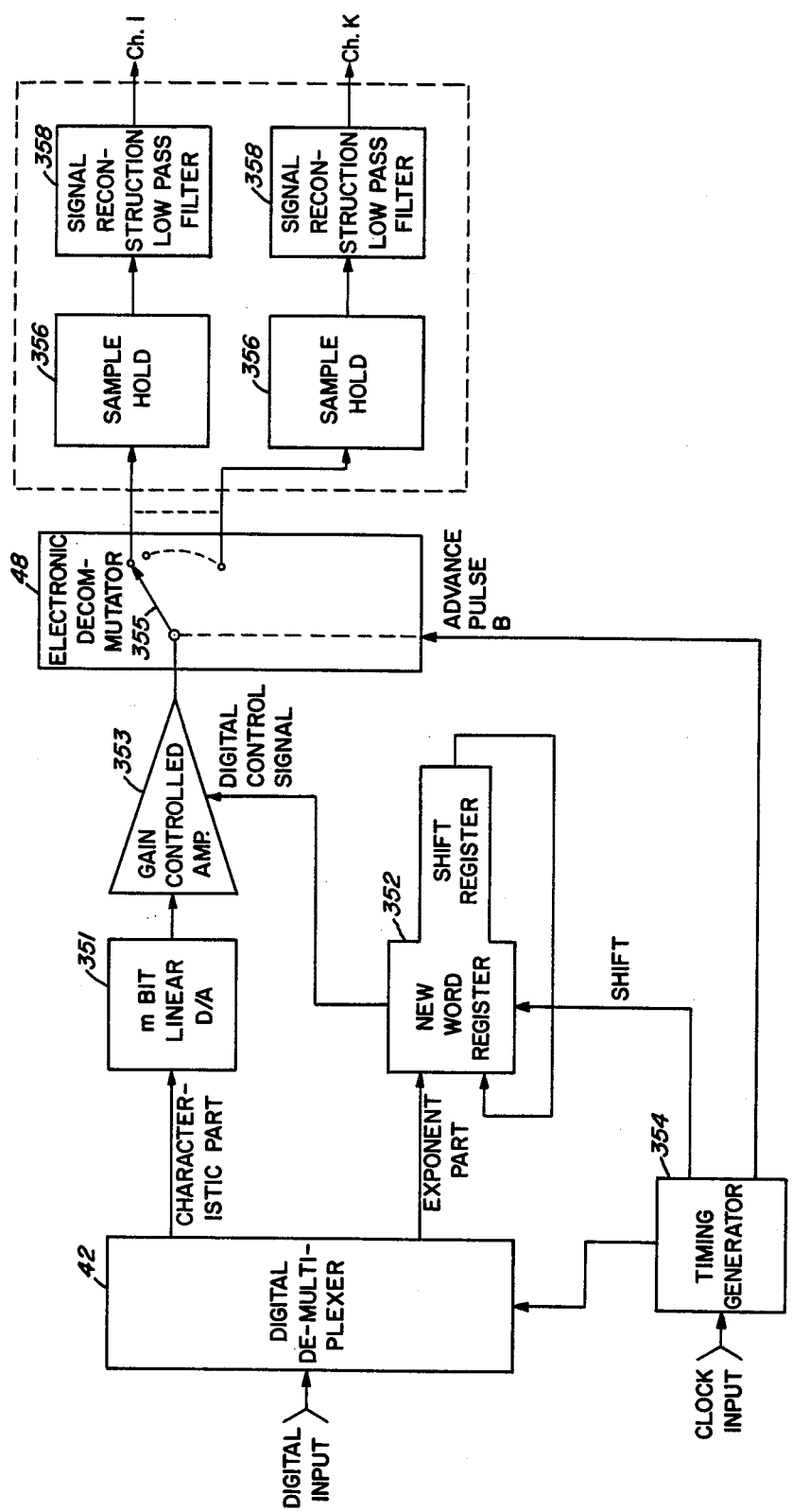

FIGS. 8A and 8B, when taken together as shown in FIG. 8 are a more detailed block diagram of the system shown in FIG. 7, illustrating a transverse decorrelation filter, maximum likelihood detector and decoder;

FIG. 9 is a more detailed block diagram showing another embodiment of a readout or playback portion of the recording system section shown in FIG. 1; the Figure also showing in detail the sync error detector depicted in FIG. 7;

FIG. 10 is a graph depicting the response of the control loops of the sync error detector shown in FIG. 9;

FIG. 11 is a block diagram of the signal conditioning, digitizing and multiplexing circuits in the input/output section 10 of the system of FIG. 1; and FIG. 12 is a block diagram of the demultiplexing, digital-to-analog converting and decommutating circuits in the input/output section 10 of the system shown in FIG. 1.

Turning now to FIG. 1, a recording system is shown which can be considered to have two parts, namely a multi-channel input and output section 10 and a recording system section 12. The input/output section 10 includes a recording channel 14 and a playback channel 16. Input signals to the recording channel 14 which are in analog form may be applied to individual input terminals 18. Digital input signals, such as the bits of binary data which are produced at the output of a computer or other digital data handling device may be applied to other input terminals 20. The entire system timing is under the control of an accurate frequency standard or clock source. The clock pulses which are applied to the individual elements of the system may be at different frequencies depending upon the speed of operation of the respective elements. Inasmuch as all of these signals are derived or synthesized from the same frequency standard 11 by means of a timing pulse or clock generator 13, as by frequency division techniques, all operations are coherent with the signals from that standard.

The analog signals from the input terminal 18 are applied to a record signal conditioner 22 having amplifiers, filters and other circuits which prepare the input analog signals for commutation. The outputs of the signal conditioner 22 are applied to a signal commutator 24 which successively samples each of the input signals, under the control of timing signals from the clock. Frame sync signals which are derived from a frame sync generator 25 also controlled by the clock are applied to the commutator 24 so as to appear in the output from the commutator 24. The sampled signals are applied to a digitizer 26, which may contain an analog-to-digital converter, and which produces digital sample words in parallel form. The digitizer 26, is also under the control of the clock and will be explained in greater detail in connection with FIG. 11.

The serial stream of previously parallel sample words of digital data which, of course, may be in the form of the absence or presence of voltage levels, is applied to a multiplexer 28. The multiplexer separates the data into a plurality of parallel streams, each along a separate one of several lines corresponding in number to the number of tracks which are to be recorded on the magnetic tape record. The multiplexer 28 is under the control of the clock. Direct digital inputs may also be applied to the multiplexer 28. A parallel-to-serial converter translates the digital input 20 into a serial bit stream which may be applied to an individual one of the output lines by the multiplexer or distributed successively amongst the several output lines in accordance with programming logic built into the multiplexer 28.

The output lines of the multiplexer are connected to the recording section 12 of the system. This recording section 12 includes separate encoders and record signal generators 30 for each track. Briefly, the encoders include circuitry for translating the bits arriving on each line into predetermined format, each containing a plurality of bits. Specifically, in this embodiment of the invention a sequence of four bits are contained in each format. The bits in each format are translated into a group of pulses, called a ternary format word, which has a zero average level. Each pulse corresponds to a different one of the bits in the format. The polarity and level of the pulses is such that the ternary word has a zero average level. The spectral characteristics of the sequences of format words are compatible with the transfer characteristic of the magnetic head and tape as they are used in the record/playback process; thus enabling very high density recording, as will be explained more fully hereinafter. Also included in the record signal generator 30 are signal whitening filters for pre-emphasizing the spectrum of the signal to compensate for spectral characteristics of the total recording system including the head and the tape, thereby enhancing the signal-to-noise response of the system and enabling recording with a very high packing density on the tape.

The spectrum of the recorded signals is contained in a limited frequency band. Accordingly, the record head and the playback head which are used in the system may be designed to handle signals in that band. The band may, for example, be from 150 KHz to 1.2 MHz. Inasmuch as this band does not include low frequency or DC components, the number of windings in the coil of each core of the head may be reduced. Also, the magnetic material of the core may be optimized for the frequency range in which recording occurs, for example, by the use of ferrites or other high frequency magnetic material. Such heads are readily constructed with close track-to-track or channel-to-channel spacing. Moreover, the use of high frequency ferrite core materials which are inherently resistant to wear provides for a longer head life than would be the case with heads which are designed to handle low frequency or DC signals. By reducing the intercore displacement (viz. increasing the head stacking density) more tracks can be recorded on narrower tape.

A separate playback head similar to and in line with the recording head may be used. In order to reduce the possibility of mechanical errors due to offsets or skew between the recorded track and the playback head, it may be desirable to use s single head for recording and playback purposes. The tape transport unit of the recorder also includes a capstan for driving the tape past the head at constant speed. The capstan is driven by a capstan motor 32 having a speed control system in the form of a dual capstan servo system 34. Preliminary control is achieved by comparing the signal from a capstan shaft tachometer 36 with a signal from the clock to provide an error signal for the capstan drive servo amplifier. This amplifier can control either a DC type capstan motor by current amplitude control, or a frequency control generator for a synchronous type capstan motor. The DC control is, however, preferable. After synchronous speed of the capstan motor is obtained, the capstan servo switches over to receive the tape speed error signal (also called sync error signals) from the center track of the tape as will be explained in connection with FIG. 9.

The output from each track is applied to readout control circuits 38 which form part of the playback portions of the recording section 12. These readout control circuits include a timing error detection system for deriving sync signals in response to the zero average characteristic of the ternary words and also in response to another reference tone recorded on each track. The sync signals for capstan control are desirably derived from the center track. Deskewing is also accomplished by means of the sync signals. Thus, the signals which are read out of the readout control circuits 38 contain the ternary words from each of the tracks. These words are in like time sequence and are coherent with the clock. These signals are provided on a plurality of lines at the output of the readout control circuits 38 which lines are connected to decoders 40. The decoders derive the binary words of information which are recorded on each track and apply these to individual lines which are connected to a demultiplexer 42.

The demultiplexer 42 derives the directly recorded digital words and applies them to output leads connected to the output terminals 44. A stream of binary sample words which represent the analog signals is provided at the other output of the demultiplexer 42. A digital-to-analog converter 46 translates these into a series of PAM pulses. These amplitude modulated pulses are decommutated in a decommutator 48 which is controlled by the clock and by frame sync pulses derived from the decoders 40. The frame sync pulses drive a frame sync generator 47 for the purpose of synchronizing the cecommutator. The outputs of the decommutator 48 each carry different trains of PAM pulses. These trains are applied to separate channels of a playback signal conditioner 50. The playback signal conditioner includes sample-hold circuits, reconstruction filters and line amplifiers so as to reconstruct the analog signals from the trains of amplitude modulated pulses. Thus, the same signals which are recorded are derived by means of the playback channel 16 of the input/output section 10.

An important feature of the input/output section 10 is its ability to readily adapt to handle a wide range of input signal formats (viz. signals of different bandwidth, dynamic ranges, etc.) to accommodate input signals which may have various bandwidth or dynamic range characteristics. Such signals sometimes require different degrees of signal resolution. By changing or switching filters in the record and playback signal conditioners 22 and 50, reprogramming the sampling rate of the commutators 24 and 48 and the number of bits per amplitude unit in the digitizer 26 and analog-to-digital converter 46 various ranges of signal bandwidths, dynamic range and resolution accuracies can be recorded and reproduced. In other words, the input/output section 10 of the system by virtue of the ease in which the recorded signals can be reformatted effectively provides for gear shift in the rate at which digital bits are produced for recording. Therefore, for some applications it may be possible to produce signals, say at the output of the multiplexer 28 which can be recorded on recording systems having a lower channel bandwidth capacity and capable of accepting signals at a lower rate than the recording section 12. Alternatively, by reducing the resolution thereby decreasing the number of bits representing each sample which is recorded, many more signals (viz., signals at a higher rate) may be recorded with the system shown in recording section 12, thereby further enhancing the signal handling capacity of the system.

Figure 2:
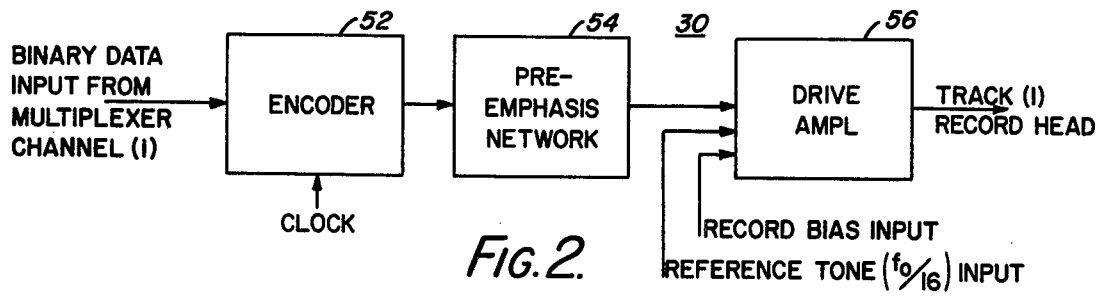
FIG. 2 is a block diagram of the portion of the system shown in FIG. 1 which processes digital information for recording on the magnetic tape record.

Turning now to FIG. 2, there is shown a single channel of the encoders and record generators 30. This channel receives binary data from the first output channel of the multiplexer 28 (FIG. 1). Additional encoder and record signal generator channels are provided, one for each of the (M) channels. Each accepts binary input data from a corresponding multiplexer channel. An encoder 52 translates the binary input data into voltage levels representing ternary words. One ternary format word having four defined ternary pulses is provided for each sequence of four binary input bits. The encoder 52 is described in greater detail in connection with FIG. 4. The stream of ternary format words is applied to a pre-emphasis network 54 to produce a spectrum which is pre-distorted to compensate for the spectral response of the record/playback system. A driver amplifier 56 applies the signal to the coil on the core of a multi-channel record head, which records the first track on the magnetic tape record. This track may, for example, be adjacent one edge of the tape.

The binary input data from the multiplexer may be in the form of NRZ voltage levels which arrive at the bit input rate. This rate is determined by the clock pulses which control the multiplexer 28 and the other elements in the input/output section 10. Consider the case where such NRZ information is applied directly to the record head in accordance with conventional NRZ recording techniques. The record/playback process has a certain spectral response characteristic. A typical characteristic for such process for a high tape speed, say 60 inches per second, and a playback head gap of 25 micro inches is shown by the solid line curve in FIG. 3. The response is far from uniform and exhibits a peak at 400 KHz. At lower frequencies, say below about 200 KHz, the frequency components are attenuated at a rate of about 6 db per octave. A null exists at about 2.4 MHz, due of course, to the gap effect of the record head. NRZ information has a spectral response similar to that shown by the curve made up of long dashes. Much of the information in the NRZ format is therefore lost during the recording process. This loss is represented by a limitation in the information storage capacity or recording density on the tape. In addition, the information content of the NRZ signal is minimal in the region where the spectral response of the record/playback process is most effective. Noise in this portion of the spectrum may therefore be recorded, thereby degrading the signal-to-noise characteristic of the system, which uses NRZ recording. Such degradation also results in a limitation upon the information storage capacity of the recording system (viz. the density at which bits can be recorded).

Figure 3:
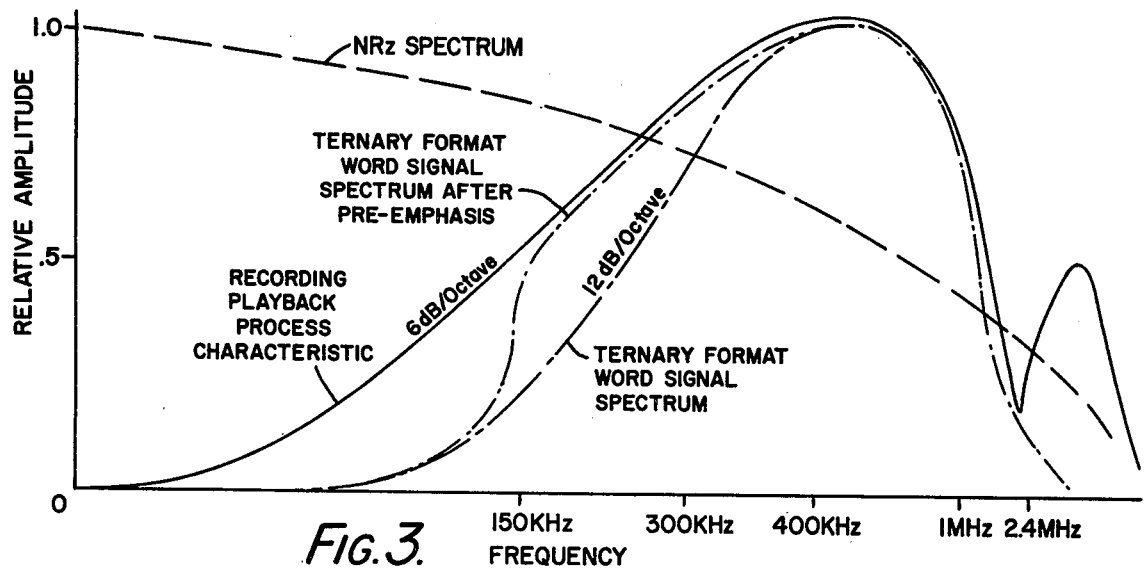
FIG. 3 is a family of curves illustrating the spectral response characteristics of various signals and of the total recording system itself.
Figure 4:
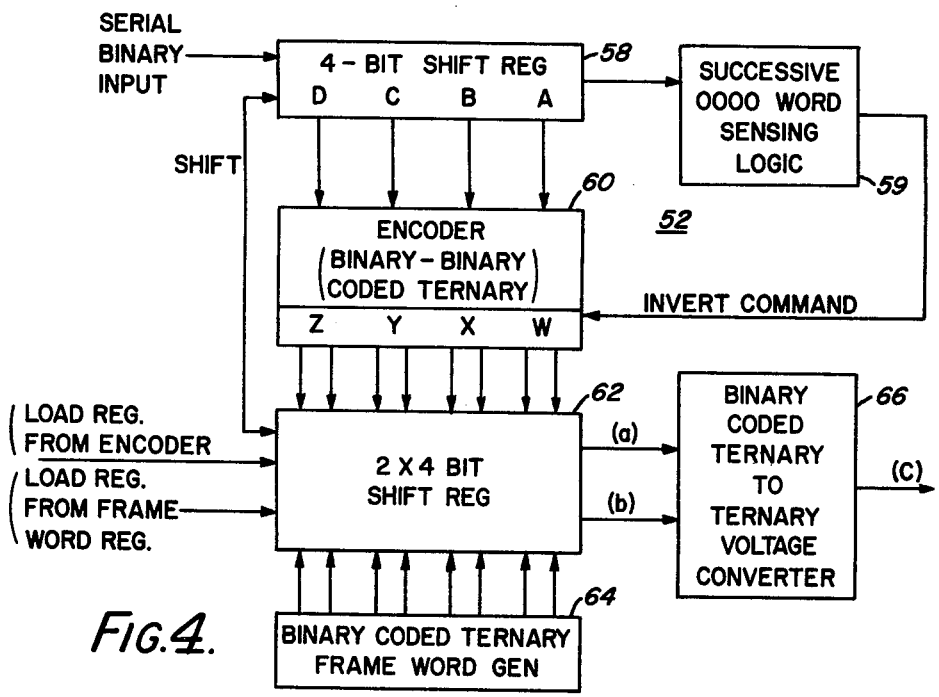
FIG. 4 is a block diagram of the encoder shown in FIG. 2.

Returning to FIG. 2, the serial input data stream is translated in the encoder 52 into a sequence of ternary format words which results in a signal having a spectrum which is similar to that of the record/playback process. This spectrum is illustrated by the curve made up of long and short dashes which is shown in FIG. 3. The encoder 52 which provides such ternary words is illustrated in FIG. 4, and is made up of a four-bit shift register 58 which receives the serial binary input. The bits arrive at the input of the shift register at the system bit rate which, as mentioned above, is synchronous with the common clock. The data is shifted into the register by shift pulses which are also derived from the common clock in proper timed sequence with the incoming bits. Four such bits, A, B, C, and D, are shown stored in the register. These bits are presented to the input of an encoder 60 which translates these bits from binary form into binary coded ternary form, in accordance with the table shown in the second and third columns of FIG. 5. The first column of FIG. 5 indicates the decimal equivalent of the binary words which can be represented by the four binary bits, A, B, C and D. Each of the bits of the ternary words, referred to hereinafter as terts, may have any of three states represented as plus, minus and zero. Accordingly, there are 91 (or $3^4$) unique four-tert words. It will be recalled that the ternary words to be recorded must exhibit a zero-average property. Thus, only 19 of such 91 four-tert words are usable. The ternary word zero, zero, zero, zero does not convey information and is therefore not used. Of the 18 words which are available, two are used to represent the binary word 0000. In order to preserve bit synchronization during a long string of input zeros, the binary word 0000 is coded alternately into antisymmetric ternary format words by which it may be represented. Another ternary word is used for frame sync. It will be observed therefore that all of the 16 possible combinations (viz. the alphabet) of the four-bit binary words A, B, C and D have corresponding ternary format words. Each tert is represented by one of three voltage levels; namely, a positive voltage level, a negative voltage level equal in amplitude to the positive voltage level and zero or ground voltage level. Each of these levels have a duration equal to the bit interval. The information content of these four-tert words is also redundant, thereby enhancing the accuracy and error performance of the decoding process on playback.

The encoder 60 translates the binary bits into binary coded ternary bits in accordance with the truth table shown in FIG. 6. Therefore, two output lines are provided for each of the binary coded ternary bits W, X, Y and Z. The binary coded ternary bits are loaded into a two-by-four bit shift register (viz. a shift register having a capacity for two four-bit words). Loading occurs upon receipt of a command to load the two-by-four bit register with the word presented by the encoder. This load command is derived from the common clock and occurs in proper time sequence with the shift pulse and with the arrival of the serial binary input bits. A binary coded ternary frame word generator 64 presents the frame sync word to the shift register. This word is loaded into the shift register in lieu of a data word once every frame cycle. A frame cycle may be defined as a complete commutation cycle in the commutator 24 (FIG. 1). The bits of the binary coded ternary words stored in the shift register are shifted out of the register by the shift pulses into a binary coded ternary-to-ternary voltage converter 66. This converter 66 operates in accordance with the truth table shown in FIG. 6, to provide a stream of terts on the output line (c) from the converter. This stream of terts is applied to the pre-emphasis network 54 (FIG. 2). This stream of terts also is a signal having a spectral characteristic shown in FIG. 3 by the curve made up of long and short dashes, as noted above the spectrum is matched to the record-/playback spectral response.

It can be shown that the ternary signal has its information content lying completely within a three-octave band extending from 1/16th to ½ the bit rate (viz. the tert rate). Thus, with a recorder having a 60 inch per second tape speed, and a record/playback bandwidth extending from 150 KHz to 1.2 MHz (similar to the response shown by the solid line curve in FIG. 3), a bit rate of 2.4 megabits per second can be handled so long as the bits are converted into ternary words having the zero-average characteristic set forth above. 2.4 megabits per second bit rate corresponds to a recording density along each track of 40,000 bits per inch. It should be noted that the 1967 standard for telemetry recorders as promulgated by the IRIG (International Range Instrumentation Group, National Bureau of Standards, Washington, D.C.) is 1,500 bits per inch per track recording density.

The capability of the recording system provided by the invention to record information at the density just mentioned is aided by the pre-emphasis network 54, and also by the system used on playback to filter, detect and decode the information. Contributions to the high packing density are also made by the precision synchronization system which operates in accordance with the zero-average property of each ternary word as well as facilitates interchannel or track-to-track deskewing.

Inasmuch as signal components below the band which contains the information content need not be recorded (via. signals below 150 KHz for the 60 inch per second recorder mentioned above) an efficient and miniaturized magnetic head may be used to record information on and read out information from the magnetic tape record. This head may be a multi-channel head having fewer turns per core, less magnetic material per core, less magnetic coupling (cross-talk) and higher core stacking density than previous heads which are designed to record signals having low frequency and particularly DC components.

The pre-emphasis network 54 performs a whitening filter operation, and may be a filter having a spectral response which is the inverse of the spectral response of the record/playback system. It should be noted that the response of the network 54 extends only over the information band of the signal which is to be recorded and drops off rapidly beyond these limits to avoid recording useless signal components. Thus, after processing in the network 54, the spectral response of the signals applied to the drive amplifier 56 is as shown in FIG. 3 by the curve made up of dots and dashes. This pre-emphasis gives rise to the following features:

(a) The signal-to-noise ratio of the system is improved, say by approximately 12 db.
(b) The spectral components of the signal which is recorded are of equal amplitude so that each component is recorded over the entire dynamic range of the record/playback process and conversely suffers the same degradation due to noise and other distortion effects in the record/playback process.
(c) The signals read out of the tape after playback will be close to an exact replica of the signal which is applied to the input of the pre-emphasis network, thereby reducing the need for signal processing after playback, except for phase equalization and noise band limiting. These operations are accomplished in the playback system.

It will be noted that the total pre-emphasis of the signal to be recorded is made possible by virtue of the spectral characteristics of the ternary zero-average signal. If a typical magnetic recorder drive signal, such as the signal resulting from NRZ techniques were to be subject to such total pre-emphasis, the low frequency component of the NRZ signal would be of such high relative amplitude as to overload the head (viz. exceed the dynamic range of the system). Also, inasmuch as pre-emphasis to match the response of the record/playback system is in the direction to attenuate the signal at higher frequencies, the information content of NRZ signals which is restricted to the higher frequency region of the spectral characteristic, would be diminished and possibly lost in the noise which is picked up in the record/playback process. With NRZ techniques also post-emphasis (integration) in the playback process is required to compensate for the 6 db per octave attenuation of the signal upon playback, such attenuation occurring in the lower frequency regions of the response characteristics. Such post-emphasis has a tendency to enhance noise at low frequencies, thereby degrading signal-to-noise performance and, of course, the error performance of typical NRZ data recording systems. Since such post-emphasis is not required in the system provided by the invention, signal-to-noise characteristics and error performance of the system are both improved.

It will be understood that, while the encoder 52 is described as providing four-tert ternary words in successive sequences (format sequences), other format sequences having different numbers of bits or terts may be employed. Also, where dynamic range is readily available in the record/playback process, a greater number of recorded levels of the pulses than equal positive and negative and zero levels as herein described may be used. The criterion which must be satisfied, however, is that each format word has a zero-average level. So long as a plurality of bits are employed (viz. two or more), zero-average format words may be encoded for recording. A four-tert format word is, however, preferred. Longer words would increase the complexity of the playback system in detecting and decoding the bits upon readout and shorter bit words reduce the information capacity of the system.

It is desirable to insert into the input of the drive amplifier 56 a high frequency recording bias in order to linearize the recording process. Such recording bias may be generated by a high frequency oscillator, say having a frequency of 10 MHz. This recording bias is combined with the signal to be recorded in a summation network at the input of the driver amplifier 56.

A reference tone having a frequency ($f_o/16$) is applied to the summation circuit in the input of the driver 56. In the 60 inch per second recorder described above, a reference tone having a frequency of 150 KHz is suitable. The tone is desirably at a frequency where the information content of the recorded signal is negligible say 2½ to 5% of the upper end of the spectrum of the signal to be recorded. This reference tone is utilized in the playback process in the elimination of timing errors on readout (viz. for synchronization and deskewing purposes, as will be described in greater detail hereinafter). $f_o$ is, of course, the bit rate or 2.4 MHz.

Turning now to FIG. 7, the playback portion of the recording system section 12 is shown. Inasmuch as all of the channels with the exception of the channel which reads out information from the center track of the (M) tracks which are recorded on the tape (viz. the M/2 track) are identical, only the channel for reading out the information from the first track, track (1), and the channel for readout from the center track are shown.

The readout from the head element which scans track (1) is applied to a preamplifier 90 which raises the level of the signals derived from track (1) to a sufficient degree for further processing, provides isolation and also matches the head impedance to the impedance of a noise control bandpass filter 89. For a 60 ips system, a bandpass extending from 150 KHz to 1.2 MHz is employed. Preamplifier noise and tape noise outside the information band is thus eliminated. An amplifier 91 matches the filter to a variable delay circuit 92. The delay circuit may be an electronic delay line including an LC (inductance-capacitance ladder network), the capacitors of which are in part either voltage variable capacitors (e.g. varactor diodes) or variable permeability inductors. An error signal is applied to the diodes or inductors, as the case may be, for controlling the delay interposed by the variable delay circuit 92 in order to compensate both for static and dynamic skew (viz. timing errors) introduced by the recording and playback process. The delay interposed by the variable delay circuit 92 is adjusted, as by trimming capacitors or inductors in its ladder network in order to compensate for static skew and other static timing errors. The variable delay circuit then is operated by its input error signal to compensate for dynamic skew and time base jitter introduced by the record/playback process. The capstan servo 34 reduces gross or coarse timing errors and brings the tape up to required speed. By virtue of the variable delay deskewing circuit 92 the terts at the output of the circuit 92 will be locked to the clock. Such locking occurs on all channels. Accordingly, all of the channel outputs as obtained from their respective delay, deskewing circuits 92 will be in synchronism both phase and frequency wise with the clock, and are therefore coherent therewith.

The output of the variable delay circuit 92 is applied to a phase shift equalization network 94 which equalizes the phase response of record/playback process and the filters 54 (FIG. 2) and 89. The equalized signal is then passed through a circuit 96 which extracts the reference tone at the frequency $(f_o/16)$. The reference tone is rejected from the signals which are applied to a format word detector circuit 98 which provides outputs representing the terts of the format word. A narrow band rejection filter 100 is inserted between the equalization network 94 and the detector 98. The ternary format word detector 98 is described in detail in connection with FIG. 8. Briefly, the detector is a transverse decorrelation filter which provides a plurality of outputs separated by the tert intervals and combines these outputs such that unwanted correlation between signals corresponding to adjacent terts is reduced. Such unwanted correlation may, for example, be due to limited resolving characteristics of the playback head or longitudinal demagnetization or cross magnetization among the terts recorded successively along the track and the finite bandwidth of the noise suppression filter 89. The detector 98 provides a plurality of outputs each corresponding to the voltage level of the terts which make up a recorded ternary format word. These outputs are decoded by a ternary word to binary word decoder 102, which will also be described in greater detail in connection with FIG. 8. The decoder 102 includes a maximum likelihood detector which selects the binary word which corresponds to the recorded ternary words on the basis that this binary word is statistically most likely to ber represented by the recorded ternary word.

An output is also applied from the detector 98 to a sync error detector 104. This error detector 104 operates on the basis that the ternary word will have a zero average when the terts which make up that word are properly registered or positioned in the detector 98. Inasmuch as the ternary word is coherent with the clock when timing errors are eliminated (viz. the recorded information is deskewed and the terts are in proper registration in the fomat word detector), an error voltage is detected when timing errors are present. The reference tone extraction circuit also provides a signal which is utilized in the error detector 104 so as to maintain synchronization notwithstanding the loss of information at the output of the format word detector 98 (viz. drop-outs on the tape), and at relatively low frequency timing error rates (jitter). Accordingly, the error detector 104 provides an error-voltage signal to the inductors or varactor diodes in the variable delay circuit 92 in response to the phase relation of the zero average representing periodic voltage received from the format word detector 98 and the clock. By virtue of the derivation and application of this error voltage, the format words produced by the word detector 98 will be in bit synchronization with the binary bits applied at the input to the recorder section 12, notwithstanding skew and other timing errors, such as jitter, in the record/playback process.

The channel which reads the signals from the center (M/2) track of the head also includes readout circuits and decoders 106 similar to the circuits described above in connection with the first track (track 1) readout control and decoders. Thus, the readout control and decoders 106 provide the serial train of binary bits from the center track and apply these bits to the demultiplexer shown in FIG. 1. The center track, as will be recalled from the discussion of FIG. 3, also has recorded thereon the frame sync word. To detect this frame sync word, the frame sync word detector 108, which may be a flip-flop connected to the maximum likelihood detector in the decoder of the center track channel, is provided. The detector 108 provides a frame sync pulse upon detection of the frame sync word. This frame sync pulse is applied to the frame sync generator (FIG. 1) in order to control the decommutator 48 to maintain the frame synchronization.

The output of the sync error detector of the readout control and decoders 106 is applied to a low-pass filter 228 (FIG. 9) in order to obtain an error voltage in response to the $(f_o/16)$ reference tone recorded on the center track for use in the capstan servo 34. The elements for generating this error voltage are described later. This low-pass filter 228 prevents the capstan servo from operating on high frequency components to which, because of the inertia of the capstan, the capstan servo cannot respond. The capstan servo utilizes this error signal in order to control tape speed and reduce flutter (below 10 Hz) in the record/playback process. It is a feature of the invention to require only a single frame sync word detector on the center channel. This feature results from the fact that the output bits from each channel are synchronous and coherent with the clock.

Referring now to FIG. 8, the information signal from which the reference tone is removed in the filter 100, is applied to an isolation amplifier 112 which matches the output of the filter to the input of a transverse decorrelation filter 114 in the format word detector 98. The filter 114 includes a delay line 115 having five sections in each of which the input signals are delayed by a period $T_o$ which is equal to a bit interval (which also equals a tert interval). In addition to the input and output of the delay line, four taps are provided between each section of the line. Thus, at each of the input and output and the taps, a sequence of signals $P_0$, $P_1$, $P_2$, $P_3$, $P_4$, and $P_5$ is provided; these outputs will correspond to a successive one of six terts which are read out of the line when a ternary format word is properly registered in the line.

As mentioned above, each tert can be correlated or degraded by the tert which precedes and follows it. In order to decorrelate the terts, decorrelation circuits 116 are provided. The decorrelation circuit for each of the terts includes three weighting amplifiers, the weighting amplifiers 118, 120 and 122 being provided for the output $P_1$ which corresponds to the first tert in a ternary word. Weighting amplifiers 124, 126 and 128 are provided for the output $P_2$ for the second tert. Weighting amplifiers 130, 132 and 143 are provided for the third tert output $P_3$. Weighting amplifiers 136, 138 and 140 are provided for the fourth tert output $P_4$. Of these weighting amplifiers, for each tert, the first (118, 124, 130 and 136) is a normalizing amplifier, thus providing an effective unity weight for that signal. The second of the weighting amplifiers 120, 126, 132 and 138 provide a weight equal to $-\alpha$. This may be accomplished by an inverting amplifier having a gain of $\alpha$. Similarly, the third weighting amplifiers 122, 128, 134 and 140 present a weight of $-\beta$ and also may be provided by an inverting amplifier having a gain of $\beta$, both $\alpha$ and $\beta$ being factors less than one, in relation the amplification provided by the normalization amplifiers 118, 124, 130 and 136. Both $\alpha$ and $\beta$ are deterministic constants related to the total response of the record/playback process. These constants may be calculated on the basis of the impulse response of the head on recording and playing back the signal and taken together with the response of the variable delay circuit 92 and the equalization networks. The impulse response may be determined theoretically based upon the spectral response of the heads and the networks. Then the convolution integral of this impulse response $h(t)$ is determined for three recorded pulses. $P_0$, $P_1$, $P_2$ where $P_1$ is registered at the impulse response maximum. The relative values of $P_0*h(t)$, $P_2*h(t)$ (convolutions) are determined. The ratios of the convolutions $P_0*h(t)$ to $P_1*h(t)$ then equals the gain $\alpha$, and the ratio of the convolutions $P_2*h(t)$ with respect to $P_1*h(t)$ equals the gain $\beta$. The values of $\alpha$ and $\beta$ may then be checked experimentally with a tape having a known pattern of recorded terts, such that the outputs of a summing amplifier 142 connected to the weighting amplifiers 118, 120 and 122 for the first output $P_1$ has a value equal to the voltage level of the tert recorded in the first position of each ternary word. The summing amplifier 142 output is indicated as being $v_1$ corresponding to the terts in the first position of the format words. The summing amplifier 142 itself may be a unity gain amplifier having a resistive summing network at the input thereof. Similarly, summing amplifiers 144, 146 and 148 provide outputs $v_2$, $v_3$ and $v_4$ corresponding to the remaining three terts of a format word. $v_2$ corresponds to the decorrelated $P_2$ output and therefore to the level of the second tert in each ternary word. $v_3$ corresponds to the level of the $P_3$ output from the line 115 after decorrelation and therefore to the level of the third tert in each ternary word. $v_4$ corresponds to the level of the fourth tert or the $P_4$ output from the line 115.

The outputs $v_1$, $v_2$, $v_3$ and $v_4$ are applied to a maximum likelihood format word detector 103 which is part of the format word detector 98 and the binary words which correspond to the ternary words represented by the levels of $v_1$, $v_2$, $v_3$ and $v_4$ are therein decoded. The detector 103 operates in accordance with a maximum likelihood, statistical decoding process whereby the one of the sixteen binary words and the frame sync word which is most likely to be represented by the levels $v_1$, $v_2$, $v_3$ and $v_4$ is detected during each ternary word interval (viz. an interval containing the four terts which make up the word). The detector is composed of two parts, namely a formation network 150 which provides eighteen outputs $S_1$ to $S_{18}$ each corresponding to different combinations of the levels $v_1$, $v_2$, $v_3$ and $v_4$. The other part of the detector is a maximum amplitude selection system 152 which detects which of the eighteen outputs $S_1$ to $S_{18}$ is of maximum amplitude and translates, via the format word identity to binary word conversion matrix 186 and shift register 187, that selection into a serial sequency of four binary bits corresponding to binary words most likely to be represented by the recorded ternary word.

The formation networks 150 include weighting circuits 154 and combining circuits 156; only the weighting circuits which operate upon the first output $v_1$ are shown in detail. It will be appreciated that the weighting circuits for the other outputs $v_2$, $v_3$ and $v_4$ are similar. The $v_1$ output is applied to the input of unity gain inverting amplifier 158. The amplifier 158 provides an output corresponding to $-v_1$. A unity gain amplifier 160 provides an output $+v_1$. It is desirable also to obtain an output equal to the negative of the absolute value of $v_1$. To this end, a full wave rectifier and normalizing amplifier circuit 162 is provided. It will be appreciated, of course, that a similar set of three outputs is provided for the $v_2$, $v_3$ and $v_4$ levels. The combining circuits 156 contain 18 summing circuits each for forming a different one of the sums $S_1$ to $S_{18}$ as shown in FIG. 5. The summing circuit 156 for $S_1$ is shown by way of example as having four equal valued resistors whose value is shown as R (R may be about 1000 ohms). In the summing circuits for the values $2v_1$, $2v_2$, $2v_3$, $2v_4$, etc., the value of the appropriate resistor will be R/2. The summing circuit 156 combines the outputs $+v_1$, $+v_2$, $-v_3$ and $-v_4$ as shown in the first row of the "Decoder" column in FIG. 5 and provides the first sum output $S_1$.

The combinations of the outputs from the formation circuits 150 are determined in accordance with the properties of the ternary words shown in FIG. 5, in the column labeled, "Ternary Voltage Word" such that each sum formed in the formation circuits 150 will have a maximum positive value in relation to the other sums when representing its corresponding ternary word. The relative values of all of the combinations are shown in the matrix labeled "Decoder Output" for each of the 18 possible words. It will be observed that only one output will have a maxmium positive relative value of four volts positive, which is removed by at least two volts from the relative value of the nearest other combination of the eighteen possible combinations.

The law of formation of these various combinations may be set forth as follows: The 18 possible combinations may be divided into two groups with reference to the ternary voltage words. The first group (group I) includes those words having two zero voltage levels in two tert positions thereof. The second group (group II) are those words which have no zero voltage levels. For the words in group I, the combinations are formed by adding:

a. the sum obtained by multiplying the voltage output, ($v_1$, $v_2$, $v_3$ or $v_4$) in the corresponding position to the tert (W, X, Y or Z) which is positive (+) by a factor of two;

b. The sum obtained by multiplying the voltage output ($v_1$, $v_2$, $v_3$ or $v_4$) in the corresponding position to the tert (W, X. Y or Z) which is negative (−) by minus two; and c. minus (−) the absolute magnitude of the output ($v_1$, $v_2$, $v_3$ or $v_4$) in the corresponding position to the tert (W, X. Y or Z) which is zero voltage.

Thus, for example, for the ternary word where W, X, Y and Z correspond to voltage levels +, 0, 0, − respectively, the sum is $(2v_1 - |v_2| - |v_3| - 2v_4)$. This sum will have a maximum relative value of +4 when the ternary word at the output of the transverse decorrelation filter 114 (viz. $v_1$, $v_2$, $v_3$ and $v_4$) is +, 0, 0, −.

For the ternary words in group II the combinations are formed by adding the two outputs $v_1$, $v_2$, $v_3$ or $v_4$ in the corresponding position to terts W, X, Y or Z which are positive (+) and subtracting the two outputs $v_1$, $v_2$, $v_3$ or $v_4$ in the position corresponding to terts W, X, Y or Z which have negative (−) values. For example, for the fourth ternary word; the tert of W position is positive (+); and the tert in the X position is negative (−); the tert in the Y position is positive (+); and the tert in the Z position is negative (−). The sum of the combination of the outputs corresponding to this ternary word is therefore $+v_1$, $-v_2$, $+v_3$ and $-v_4$. This sum will have a relative value of +4 which is higher by at least two units than the relative value of any of the other sums formed in the summing circuits 156 when the outputs correspond to the fourth ternary word (viz. a word having a decimal value of three.)

The circuits 152 which detect the output $S_1$ through $S_{18}$ of maximum value may be considered to be decision circuits. These circuits are controlled by the clock to make a decision when a clock pulse indicates the ternary word is properly registered. A strobe pulse indicated by the letter $T_s$, which is generated by the clock, loads a flip-flop register 183 in the decoder 102 to read the maximum value of the combinations $S_1$ through $S_{18}$ at the exact moment the format word is properly registered in the line 115. The decision circuits 152 include a maximum sum detection network 168. The maximum sum detection networks include 18 separate circuits 172, the first of which operates on the sum $S_1$ and the last of which operates on the sum $S_{18}$. Each of these circuits 172 includes a transistor 174 which is base connected to the output of a different one of the summing circuits in the combining circuits 156. The emitters of the transistors are connected to a common current source 176 which is indicated as being a field effect transistor 178 having a constant gate bias voltage applied to its gate electrode from a source indicated at +C and a voltage from a source indicated as −B applied to its drain electrode. The collectors of the transistors 174 are connected to a source indicated by +B by way of separate resistors 180. The resistors 180 and the transistors 174 are selected such that, for a maximum relative value of +4, current flowing through one of the transistors 174 which receives that maximum value will raise the common emitter point sufficient to bias the remaining transistors of each of the remaining circuits 172 to their non-conductive conditions. Thus, only one of the resistors 180 will have a voltage drop thereacross. This voltage drop is detected by a comparing amplifier 182 which may be a comparator, differential or operational amplifier. Only 16 comparators 182 are required for the center track readout channel and fifteen for the remaining readout channels, since two of the format words have zeros in each of their positions, and frame sync is only detected on the center track channel. The direct and inverting inputs to these comparators 182 are connected across the resistors 180. The comparator outputs are applied to trigger their associated flip-flops 184 in the register 183. At the appropriate trigger time, only one of the comparators 180 will provide an output, which may be considered to be a binary "one" level. The flip-flops 184 are first reset by reset pulses from the clock which are applied to their reset inputs. The strobe pulse $T_s$ is applied to the gate or initiating inputs of these flip-flops. The $T_s$ pulse occurs shortly after the reset pulse. Thus, an output corresponding to the decision made in the circuits 168 is loaded into one of the flip-flops. The remaining sixteen flip-flops 184 stay reset; thus an output from the set output terminal of one of these flip-flops 184 will be a binary "one" level. A format word identity to binary word conversion matrix 186 receives the levels from 15 of the flip-flops 184 in the register 183 and converts these levels into the bits of the binary words corresponding to the ternary work read out from the tape. This matrix 186 includes four eight input OR gates having outputs A, B, C and D corresponding to the binary bits and operates in accordance with the following table, where $S_2$, $S_3$, etc. are the flip-flop outputs:

$$A = S_9 + S_{10} + S_{11} + S_{12} + S_{13} + S_{14} + S_{15} + S_{16}$$

$$B = S_5 + S_6 + S_7 + S_8 + S_{13} + S_{14} + S_{15} + S_{16}$$

$$C = S_3 + S_4 + S_7 + S_8 + S_{11} + S_{12} + S_{15} + S_{16}$$

$$D = S_2 + S_4 + S_6 + S_8 + S_{10} + S_{12} + S_{14} + S_{16}$$

The binary words are loaded into a shift register 187 by a load command from the clock. The bits of the binary words are shifted out of the register by shift pulses also obtained from the common clock. The shift pulses occur, at the bit rate. Thus, a serial train of binary bits at the bit rate are read out of the register 187 and are applied to the demultiplexer 42 (FIG. 1). The flip-flop 184 associated with the decision circuits 152 for the center (M/2) track which handles the sum ($S_{17}$), constitutes the frame sync word detector 108. The frame sync word detector reads out a frame sync pulse which is applied to the frame sync word generator which controls the 24 decommutating circuits 48 in the input/output section 10 (FIG. 1).

An important feature of the ternary word to binary word detector 102 is that the maximum likelihood detection process is capable of recognizing a ternary format word notwithstanding variations in the attenuation characteristics (viz. transmission gain) of the record/-playback process. Generally, the transmission gain of the record/playback process can vary over a wide range, typically −15 to 18 db during a dropout. However, such variations are generally much slower than the ternary word rate. Thus, during each ternary word the gain of the record/playback process is essentially constant. Therefore, the relative levels of the outputs $v_1$ $v_2$, $v_3$ and $v_4$ on which the maximum likelihood decision is based is also relatively constant.

The sync error detector 104 is shown in greater detail in FIG. 9. This detector provides an error signal representing deviations from format word sync (viz. when the format words read out of the tape are not coherent with the clock). FIG. 9 also illustrates another embodiment of the detector 98. The readout from the head element which scans track (1) is applied to the playback channel for that track which is shown in FIG. 9. It will be appreciated, of course, that similar playback channels are provided for each of the other (M) tracks with slight modifications for capstan servo control on the center track channel. The amplifiers and filters 281 which are similar to the amplifiers 90 and 91 and filter 89, preamplifies and filters the output signal from the head and may also provide some phase equalization for the record/playback process. The variable delay circuit 283 may be an active delay line similar to the delay line 92 which is described in connection with FIG. 7. The output of the delay circuit 283 is passed through another amplifier 287 which, like the amplifier 281, is a buffer amplifier. The amplifier 287, however, also includes a phase shift equalization network to compensate for the phase shift in the record/playback process. The variable delay circuit, however, may have a flat phase shift characteristic over the band of the signal read out from the head. Therefore, no additional phase equalization to compensate for the variable delay circuit phase shift need necessarily be provided. The output of the amplifier 287 is fed both to a reference tone extraction circuit 289 and to a reference tone rejection filter 291. The reference tone, as noted above, is desirably at a frequency at the low end of the spectrum of the recorded ternary word signal, say in the vicinity of 1/16th of the bit rate. Since the bit rate is 2.4 MHz in the system herein described, the reference frequency may suitably be at approximately 150 KHz. This reference frequency is therefore in a range, as may be noted with reference to FIG. 3 where little information content is contained in the ternary readout signal. The level of the reference signal is also low with respect to the level of the ternary information signal which is recorded on the track. Accordingly, the removal of the reference tone by a narrow band rejection filter 291 does not materially degrade the information. An amplifier 290 is shown between the rejection filter 291 and the format word detector 292. A similar amplifier may be inserted between the filter 100 and the detector 98 (FIG. 7). This amplifier 290 is a buffer amplifier which provides requisite impedance matching characteristics. The detector 292 includes a transverse decorrelation filter including a delay network 294. The network has two sections which may be LC ladder networks, each providing a delay equal to $T_0$ ($T_0$ being equal to the tert interval). The outputs of the filter are indicated as $P_0$, $P_1$ and $P_2$, each corresponding to a different one of three successive terts. These outputs are applied to weighting amplifiers 296, 298 and 200, similar respectively to the weighting amplifiers 120, 118 and 122 (FIG. 8). The weights are selected in accordance with the techniques mentioned in connection with FIG. 8 such that the output $v_1$ from a summing amplifier 202 corresponds to the tert (W) from which degradation due to the adjacent terts immediately proceeding and succeeding it are eliminated or decorrelated. Another delay line 204 having three sections, each providing delay of $T_0$ is connected to the output of the summing amplifier 202. This delay line provides the four terts which make up a ternary word. These terts are represented by their levels $v_1$, $v_2$, $v_3$ and $v_4$. The tert levels then may be applied to the formation networks of the maximum likelihood detector and thence to the ternary word to binary word decoder 102. The detector 292 will include formation networks similar to the networks 154 and combining networks similar to the network 156, together with the decision circuit 152 (FIG. 8). Inasmuch as one tert is handled at a time by the detector 292, significant savings in components are provided in accordance with the embodiment of the invention as described in FIG. 9.

The sync error detector itself includes a summing amplifier 206 which combines the output tert levels $v_1$, $v_2$, $v_3$ and $v_4$. Inasmuch as the ternary format words each have an average level of zero, the summing amplifier 206 will produce an output having a zero crossing or null coincident with proper registration of the ternary words in the line 204, once during each ternary word interval (viz. at a repetition rate equal to one-fourth the bit rate ($f_o/4$). The summing amplifier 206 output may approach zero either from the positive or negative direction. Accordingly, an absolute magnitude circuit 208, say in the form of a full wave rectifier and normalizing amplifier, responds to the output of the summing amplifier 206 and provides an output always of the same polarity, say positive, with null points recurring at the word rate ($f_o/4$). A signal from the clock having the same frequency ($f_o/4$) is applied, together with the absolute magnitude circuit 208 output signal to a summing amplifier 210. An attenuator 212 assures that the clock signal is of much lower amplitude, say 20 db down, from the level of the absolute magnitude circuit output. The relative attenuation of the clock signal is required in order to preclude or prevent the clock from overriding or assuming control of the generation of the sync error signal, when the timing error in the signal is beyond the control range of the zero-average ternary word signal resulting from the operation of the summing amplifier 206 and the absolute magnitude circuit 208. The summing amplifier 210 provides an output to a wide band selective filter 214 which is tuned to pass a bandwidth equal to about $f_o/20$ centered about the ternary word rate ($f_o/4$). Maintenance of adequate bandwidth will insure servo loop stability. The output of the filter which, of course, is a sinusoidal signal, is hard limited in a limiter circuit 216. This limiter circuit provides a square wave at the ternary word rate ($f_o/4$) to a phase detector 218. The phase detector may be a digital phase detector or an analog detector having an output depending upon the phase difference between the limiter output and the clock signal which is also applied to the detector 218.

The phase detector output is passed through a bandpass filter 221 which, as will be explained more fully hereinafter in connection with FIG. 10, may have a bandpass center at approximately 300 Hz and a response which rolls off at 6 db per octave on either side of this break point. The phase detector 218 will not, however, provide any significant output level for timing errors which vary at a rate below 100 Hz, since the reference tone control loop assumes control at lower frequencies. Thus, the zero-average ternary word signals provide control of time base jitter and dynamic skew at rates above 100 Hz. Dynamic skew and jitter above the rate of 10 KHz will occupy an insignificant portion of tert interval and thus have no significant effect on the detection of format words via their tert components. For example, timing errors above a 10 KHz rate has a worse case displacement of ±30 nanoseconds which is 7.5% of a tert interval. Such timing errors are readily tolerated in the system. The capstan servo system of the recorder is controlled by an error signal derived from the reference tone control loop for the center track and responds to timing errors below 10 Hz. The capstan servo therefore removes such timing errors leaving a residual timing error due, for example, to jitter and to dynamic skew with respect to the center track which are at rates above 10 Hz. Such timing errors are in their worst case about ±1.5 microseconds.

The ternary word zero-average signal has a predominant frequency component, as mentioned above, of $f_o/4$ and the phase detector 218 therefore can provide output signals over a capture range equal to one period at this rate, therefore compensating for timing errors which may occupy a 667 nanosecond error band. Since 600 nanoseconds of timing error for a recorder running at 60 inches per second corresponds to the residual jitter and dynamic skew at rates above 100 Hz, the phase detector 218 output compensates for such high frequency timing errors. The reference tone at $f_o/16$ is used to generate sync error control signals which compensate for the remaining timing errors at rates below 100 Hz. Inasmuch as a cycle of the reference tone has a duration of 6/65 microseconds, with a corresponding capture interval, the reference tone control loop eliminates timing errors over the worst case range (viz. ±1.5 microseconds). The reference tone is extracted by a phase locked detection circuit 289 having a selective filter 220 tuned to the reference tone frequency ($f_o/16$). Its bandwidth desirably exceeds 3 KHz to insure servo stability. A hard limiter 224 which receives the selective filter 220 output and a summing amplifier 222 are also included in the reference tone extraction circuit 289 which is regenerative over a band centered at the reference tone frequency ($f_o/16$). Thus, the output of the limiter is locked to the reference tone. The signal-to-noise ratio of the desired reference tone is enhanced by the phase locking action of the circuit 289 and the reference tone is effectively amplified to the desired level for phase detection in a phase detector 226 in which it is compared with the clock at a frequency of ($f_o/16$). The output of this phase detector 226 is filtered in a low pass filter 228 having a characteristic shown in FIG. 10 by the curve identified by the legend (*a*). This curve illustrates that the low pass filter has a crossover point with the frequency response of the bandpass filter 220 (curve (*b*)) at 100 Hz and thereafter falls off at 6 db per octave.

The output of the low pass filter is supplied, together with the output of the bandpass filter 221 to a summing amplifier 230, on all channels with exception of the center track. The output of the summing amplifier is passed through a control amplifier 232. The output of the amplifier is the sync error signal which is used to control the delay of the variable delay circuit 283 and thereby deskew and remove timing errors from the ternary word signal readout from the head. The loop gain is adjusted by means of the amplifier 232 to assure stability. Also, by means of adjustment of the amplitude of the signal from the extraction circuit 189, say by means of variable gain amplifiers and attenuators, not shown, the loop gain of the reference tone loop is zero at about 3 KHz, whereas the loop gain of the ternary word zero-average signal loop is zero at about 30 KHz. This loop gain is sufficient in regions from 100 Hz and below to provide sync error signals in response to the reference tone signal readout from the tape. The loop gain is also sufficient at least, say to 10 KHz, for the ternary word zero-average signal to generate the error signal control from 100 Hz to approximately 10 KHz. As mentioned above, the timing errors above 10 KHz are readily tolerated by the system. No control of the generation of the sync error signal is exerted by the ternary word zero-average signal below 100 Hz, since the phase detector 218 will not produce any significant output when the timing error is worse than approximately 600 nanoseconds (corresponding to a rate of 100 Hz) in such case the amplitude of the $f_o/4$ component of the ternary word zero-average signal at the output of the absolute magnitude circuit 208 is below the amplitude of the clock signal ($f_o/4$) notwithstanding its attenuation in the attenuator 212. Thus, clock signals override the ternary word zero-average signal.

The center track reference tone loop error signal is not directed to summing amplifier 230 as with the other channels, but (as shown in FIG. 7) is fed to the capstan servo drive amplifier to control tape speed accurately and remove time base jitter below 10 Hz on the center track signal.

Before turning to FIGS. 10 and 11 which show an exemplary embodiment of the input/output section 10, consider that an analog signal to be recorded may be thought of as being composed of a carrier component and an envelope component, with the envelope spectrum bandwidth being many times smaller than the carrier spectrum bandwidth. By sampling the envelope signal amplitude, at a rate which, of course, exceeds the Nyquist rate based upon the envelope signal frequency, and applying these sampled signals to a logarithmic analog-to-digital converter, an exponential signal word for each such sample is generated. The carrier components may be sampled and applied to a conventional linear analog-to-digital converter. Before such application, however, the sampled carrier signals are applied to a gain controlled amplifier. The gain of this amplifier is adjusted by the exponential signal words in such a manner that the input to the linear analog-to-digital converter is always within its dynamic range. This may, from one point of view, be thought of as a normalization process. Two digitized signals now represent each sample, namely the output word of the analog-to-digital converter and the exponential word signal. For example, if the analog-to-digital converter is adapted to handle a dynamic range of 60 db and the analog signal should increase beyond this range, the exponential word signal will reduce the gain of the amplifier so that the input to the linear analog-to-digital converter is again within the 60 db range.

Table I depicts the format of the digitized signal which represents a sample of an analog input signal. The digitized signal is comprised of an "*m*" bit characteristic part and an "n" bit exponential or mantissa part.

TABLE I

| Sign bit | Linear Sample Word (m-1) bits | Logarithmic Sample Word (n) bits |
|---|---|---|
| | "m" bit characteristic | "n" bit exponent or mantissa |

Turning to FIG. 11, the signal conditioning circuit 22 is shown comprised of a number of identical circuits for each input channel. The first and the last of (K) input channels are shown by way of example. Two circuit paths are provided in the conditioner 22 for respectively deriving the carrier and the envelope signal in each channel. The carrier signal path has a low pass aliasing filter 301 having a cut-off, say of $3/2 f_c$, where $f_c$ is the maximum carrier frequency to be encountered and passes the carrier signal but introduces rapid attenuation above the upper end of the carrier bandwidth to prevent aliasing errors in the samples produced by the commutator 24. The second path of each channel includes an absolute magnitude circuit 302 and a sampling filter 303. The absolute magnitude circuit may be a full wave rectifier. The sampling filter smoothes the rectified signal so as to present an output which corresponds to the envelope of the incoming analog signal. It will be noted that the spectrum of the envelope is considerably narrower in bandwidth than the spectrum of the carrier at the output of the aliasing filter 301. Thus, the sampling rate for the envelope need not be as fast as the sampling rate for the carrier in order to preserve the information content of the envelope without developing ambiguities.

The commutator 24 is an electronic stepping switch having two switch sections 199 and 307, diagrammatically shown in FIG. 11 to simplify the illustration. The switch sections have the same number (K) of input terminals (sampling locations) each for a different one of the input channels. However, the sections advance and sample their channel at different rates, for example, the section 199 advances one step for every (K) steps (1 cycle) of advance of the section 307. Advance pulses A and B, the former having a repetition rate (1/K) of the rate of the latter, are obtained from a timing generator 308 synchronized by the clock. These pulses are applied to the stepping logic for their respective commutator sections so as to effect sampling of the input signal in synchronism with the clock. The timing generator also provides a pulse for inserting a frame sync word into the digital multiplexer 28 as explained in connection with FIG. 1. The samples of the envelope signal are injected into an "n" bit logarithmic analog-to-digital converter 310 say having 6 db resolution. The converter 310 develops the exponential signal word for each sample and applies them to a recirculating shift register and also to the digital multiplexer 28.

The shift register 313 contains a new word register portion as well as portions for storage of (K−1) exponential signal words or a total storage capacity for (K) words. These words are circulated around the register at the rate at which the carrier signals are sampled by the commutator switch section 307. Word shift pulses are applied to the register from the timing generator in synchronism with the advance pulses (B) so that the exponential signal word in the new word register portion is derived from the same channel as the carrier signal sample which is then being taken by the high speed commutator switch section 307. A new exponential signal word is loaded into the new word register portion for each cycle of the high speed section 307 in response to a load pulse from the timing generator 308. That exponential signal word is recirculated in the register 313 and reappears in the new word register portion in each of the (K−1) cycles during the period in which the channel from which it was derived is sampled by the high speed commutator section 307. The shift register 313 controls the gain of a digitally controlled amplifier 309.

The amplifier 309 may, for example, include an operational amplifier having a plurality of attenuators in its feed back path each corresponding to a different bit in the exponential word signal. Each attenuator presents a value of attenuation related to the order of its corresponding binary bit. Thus, for example, if the log analog-to-digital converter 310 has a dynamic range of 70 db, represented by an exponential signal word having four bits, four series attenuators in the feed back path of the amplifier 309 would present attenuations of six, 12, 24 and 48 db respectively. If the exponential word signal presented to the amplifier 309 was 1, 0, 1 1, the relative attenuation inserted by the amplifier will be 66 db. By means of this arrangement, an increasing amplitude of the analog signal will be sensed by the logarithmic analog-to-digital converter 310, which is adapted to reduce the gain of the amplifier 309 so that the input to a linear analog-to-digital converter 311 is kept within its dynamic range. The output sample words of the converter 211 is injected into the multiplexer 28, as are these corresponding exponential word signals. These two signals are interspersed, developing an output digital signal which is applied to the high density recorder section 12. The characteristic bits are sent at a higher rate than the exponential bits, thus achieving a lower bit rate. It should be noted that inasmuch as the envelope signal has been rectified, the analog-to-digital converter 311 must assign one of its bits the task of indicating when an analog signal is either positive or negative. The first of its bits performs this role.

Returning to FIG. 11, the digitized output word from the multiplexer consists of an "m" bit characteristic part and an "n" bit exponential part. The "m" bit part is subdivided into a sign bit and "m−1" sample bits for representing the amplitude of a signal within a fixed dynamic range. If the signal is outside this range, this fact will be indicated by the "n" bit exponential or mantissa part. The system's dynamic range in decibels (D) may be computed from the following equation:

$$D = 20 \log_{10} 2^{(m-1)} + 20 \log_{10} 2^{(2^n-1)} \qquad (1)$$

or rewritten:

$$D = 6(2^n + m - 2) \qquad (2)$$

By means of this equation (1) the following table has been constructed which shows the dynamic range in db of the system by using an exponential and characteristic bits to represent a sample.

| n \ m | 2 | 3 | 4 | 5 | 6 | 7 | 8 | 9 | 10 | 11 | 12 |
|---|---|---|---|---|---|---|---|---|---|---|---|
| 0 | 6 | 12 | 18 | 24 | 30 | 36 | 42 | 48 | 54 | 60 | 66 |
| 1 | 12 | 18 | 24 | 30 | 36 | 42 | 48 | 54 | 60 | 66 | 72 |
| 2 | 24 | 30 | 36 | 42 | 48 | 54 | 60 | 66 | 72 | 78 | 84 |
| 3 | 48 | 54 | 60 | 66 | 72 | 78 | 84 | 90 | 96 | 102 | 108 |
| 4 | 96 | 102 | 108 | 114 | 120 | 126 | 132 | 138 | 144 | 150 | 156 |
| 5 | 192 | 198 | 204 | 210 | 216 | 224 | 228 | 234 | 240 | 246 | 252 |

For a specific example, note that 11 "$m$" bits are required for 60 db dynamic range if no exponential bit is used, whereas 4 "$m$" bits and 3 "$n$" bits, a total of 7, are only needed with the format in accordance with the present invention for a 60 db range.

The specific "$mn$" bit combinations selected will normally be determined upon the sample resolution required by the "$m$" bit characteristic part of the word format. The sample resolution "R" may be expressed as a percent of maximum linear range of the analog-to-digital converter 311 in accordance with the following relationship, which for convenience has been summarized in Table III.

$$R = 100 \times 2^{(1-m)} \quad (3)$$

TABLE III

| m | 2 | 3 | 4 | 5 | 6 | 7 | 8 | 9 | 10 | 11 | 12 |
|---|---|---|---|---|---|---|---|---|---|---|---|
| R | 50 | 25 | 12.5 | 6.25 | 3.125 | 1.562 | .781 | .391 | .195 | .098 | .049 |

The actual formating for an assumed set of circumstances may readily be determined. Given $f_c$ = Maximum signal carrier frequency
$f_e$ = Maximum envelope frequency
D = Desired dynamic range db
R = Desired resolution in percent
K = Number of channels From the desired resolution, the number of bits in the characteristic part may be found from Table II or equation (2) selecting "$m$", of course, as an integer value. The exponential bit number "$n$" may now be obtained from Table II, or equations (1) or (2). Here again, "$n$" should be selected to be an integer.

Now if we define the sampling ration "$r$" to be the ratio of $f_c/f_e$ maximum signal to maximum envelope frequencies, a total frame (F) of data will be found by the following equation:

$$F = K(n + mr) \quad (4)$$

For a specific example, suppose the following values are assumed:

$f_c$ = 20 KHz, maximum signal frequency
$f_e$ = 1 KHz, maximum envelope frequency
D = 60 db, dynamic range
R = 12.5% resolution
K = 24 and the sampling rate is selected to be three times the highest frequency of a signal and above the Nyquist rate. The following relationships can easily be developed.

bits in characteristic from Table III, $m = 4$
bits in exponent from Table II, $n = 3$
Sampling ratio, $r = f_c/f_e = 20$
Bits in a frame of data, $F = K(n + mr) = 1.992 \times 10^3$ bits
System bit rate, $S = f_c \times 3 \times F/r = 5.976 \times 10^6$ bits/sec Summarizing, the coded exponent is generated at a slower sample rate than the characteristic, and it is stored for each channel in a shift register 313. Actually, a complete set of coded exponents for each of the sequential input channels is held in this shift register. As the commutator 24 samples its various input signal channels, the appropriate exponential word signal for the gain control amplifier 319, appears in the new word register portion of shift register 313. The coded exponent thus is available to the gain controlled amplifier together with the wideband samples at the higher sampling rate. The exponential word signal is updated via the "$n$" bit logarithmic analog-to-digital converter 310 through the new word register at a much lower rate. Thus, data will circulate through the shift register several times before being updated by the logarithmic analog-to-digital converter 310. The playback portion of the input/output section 10 (FIG. 1) provides an inverse function to that shown in FIG. 11 and is therefore described briefly in connection with FIG. 12. A stream of digital format words is first applied to the digital demultiplexer from the high density recorder and are separated into their characteristic and exponent parts. The timing pulses for the demultiplexer are obtained from a clock synchronizer timing generator 354.

The timing generator 354 sequences the demultiplexer 42 so that the characteristic part is sent in an "$m$" bit linear digital-to-analog converter 351, and the exponent part is sent to the shift register 352. After one frame of operation, a complete set of exponent signals are fed into the new word register and lie in sequence in the shift register 352. The appropriate exponent for each channel appears in the new word register and is sent as a control signal to a digital gain controlled amplifier 353. The gain controlled amplifier adjusts its gain so that the reconstructed sample at the output of the linear digital-to-analog converter 351 corresponds to dynamic range to the original analog sample just before it was digitized. Another embodiment of the playback portion can combine the characteristic and exponential bits in a logic network to form a longer linear binary word. A higher dynamic range digital-to-analog converter is used to translate the longer binary word into an analog signal, thereby eliminating the gain controlled amplifier.

The reconstructed sample is sent to an electronic decommutator 48, which includes only one switch section 355 advanced by a pulse (B) from the timing generator. This advance pulse is at the same rate as the pulse (B) of FIG. 11 and hence, decommutates the samples and applies them to their corresponding channel sample and hold circuits 356 and sample reconstruction low pass filters 358 which are located in the playback signal conditioner 50. The sample and hold circuits store the sample level for a sample period and the signal reconstruction low pass filter provides the filtering necessary to remove the high frequency transients and other ambiguous signal components not wanted at the output. Of course, at the output of each channel is the reconstructed analog signal.

From the foregoing description, it will be apparent that an improved recording system and its associated circuits and systems are described. Although an exemplary embodiment of a recording system is shown, variations and modifications will, of course, become apparent to those skilled in the art. For example, the ternary word signals may be transmitted over a link, other than a record/playback mechanism, and derived therefrom so long as the link has a spectral response similar to the spectral characteristics of the ternary word signals. The foregoing description should therefore be taken as illustrative and not in any limiting sense.

What is claimed is:

1. The method of processing digital information for high density data transmission via an information carrying medium which comprises the steps of translating said information into a series of successive data words each having a given number of binary bits, and successively encoding each of said data words into a format word selected from an alphabet of format words, each having a series of signals equal in number to said given number and having zero average amplitude, controlling the reception of said format words from said medium in accordance with their zero average amplitude characteristic that each of said words is segregated, and retranslating said format words into data words corresponding thereto.

2. The method as set forth in claim 1 including the step of synchronizing the occurrence of said translated format words with a clock so that said words are coherently related to said clock, and wherein said reception controlling step includes the step of adjusting the time of reception of said format words in accordance with said coherent relationship between said clock and said format words as manifested by their zero average characteristic.

3. The method of transmitting information according to claim 1 wherein said translating step includes the step of modifying the spectral characteristic of said format words inversely with respect to the spectral transfer characteristic of said medium.

4. The method of processing digital information for high density data transmission via an information carrying medium which comprises the steps of translating said information into a series of successive data words each having a given number of binary bits, and successively encoding each of said data words into a format word selected from an alphabet of format words, each having a series of signals equal in number to said given number and having zero average amplitude wherein said series of signals of each said format word contain unique combinations of signals having different discrete values, including additional steps of detecting values of the signals in each of said series upon reception, detecting the format word corresponding to each said detected series on the basis that the combination of said values of said signals in said series is closest to the combination of values of the series of signals which constitute the detected format word, and timing the reception of said format words in accordance with the occurrence of zero amplitude points of the sum of the values of the signals in each of said series.

5. A system for processing digital information for high density data transmission via an information carrying medium comprising means for translating said information into a series of successive data words each having a given number of binary bits, means for succesively encoding each of said data words into a format word selected from an alphabet of format words, each having a series of signals equal in number to said given number and having zero average amplitude, a source of clock signals, said means for encoding being controlled by said clock signals for producing said format words in coherent relationship therewith, a detector which derives the format words at the receiving end of said medium, said detector including means for identifying the time of reception of each of said format words in accordance with its zero average characteristic, and means responsive to deviation between the time of reception of said format words, as identified by said last named means and the clock signals for controlling the reception of said format words.

6. The invention as set forth in claim 5 including a decoder for translating the format words each into their corresponding data words.

7. The invention as set forth in claim 5 wherein said means for encoding includes means for providing each of said series of signals with a unique combination of signal amplitudes, wherein said detector includes means for providing a plurality of outputs each corresponding to a different signal in each group, and means for detecting which of said plurality of format words is most likely to be represented by the combination of said plurality of outputs.

8. The invention as set forth in claim 7 wherein means in said detector for providing said plurality of outputs is a transverse decorrelation filter.

9. The method of synchronously receiving information which is transmitted via an information carrying medium in the form of a series of format words each consisting of a series of signals having a zero average signal level comprising the steps of detecting the points in time when said received words have a zero signal level, and delaying said received words prior to said detecting step to reduce deviations from synchronism from the occurrence of said zero signal level points.

10. The method as set forth in claim 9 wherein said words are transmitted in synchronism with a clock signal, and wherein said delaying step includes the step of comparing the occurrences of said zero signal level points with the occurrences of said clock signal.

11. The method as set forth in claim 10 wherein a reference tone synchronous with said clock signals and having a frequency lower than the repetition rate of said format words is transmitted together with said format words including the steps of separating said reference tone from said received format words, and controlling the delay of said received words in accordance with deviations from synchronism between said reference tone and said clock signals when deviations from synchronism of said zero signal level points and said clock signals occur at lower than a predetermined rate.

12. The method of synchronously transmitting and receiving of information comprising the steps of
encoding said information into a signal constituted of a series of format words each consisting of a series of signals having zero average level for transmission, detecting from the received format words a signal occurring each time said received words exhibit a zero level, and synchronizing the reception of each of said words with said detected zero level signal.

13. The method as set forth in claim 12 wherein said encoding step is accomplished so as to provide each of said words in synchronism with a clock signal and wherein said synchronizing step includes the steps of comparing said clock signal and said zero level signal to provide an error signal representing deviations in phase therebetween, and delaying said received format words in accordance with said error signal prior to detection of said zero level signal thereby reducing said phase deviations.

14. The method as set forth in claim 13 including the step of transmitting together with said format words a reference tone synchronous with said clock signals and having a frequency which is near the lower end of the frequency spectrum of said format words, comparing said clock signal with said reference tone to provide a second error signal representing deviations in phase therebetween, and delaying said received format words in accordance with said second error signal prior to detection of said zero level signal when said second error signal lies in a relatively low frequency band, while delaying said received format words in response to said error signal named in claim 17 when said last-named error signal lies in a relatively high frequency band above said relatively low band.

15. A system for synchronously receiving information transmitted in the form of successive format words each having a zero average signal level comprising
 (a) a channel for passing said received format words including a variable delay device responsive to an error signal, and
 (b) a control loop for generating said error signal including
  (i) means connected to the output of said delay device for generating a signal in response to occurrence of zero voltage levels of said format words,
  (ii) means for detecting changes in the phase of said zero voltage level signal to produce said error signal, and
  (iii) means for applying said error signal to said delay device.

16. The invention as set forth in claim 15 wherein said format words are transmitted coherently with a clock signal and wherein said detecting means comprises a phase detector for comparing said clock signals and said zero average signals.

17. The invention as set forth in claim 16 wherein a reference tone lower in frequency than the repetition rate of said format words and also coherent with said clock signals is transmitted together with said clock signals including a second control loop for generating a second error signal which comprises,
 (a) means for extracting said reference tone from said received format words,
 (b) a phase comparator responsive to said extracted reference tone and said clock signals for deriving said second error signal, and
 (c) a low pass filter for applying said second error signal to said delay device.

18. The invention as set forth in claim 17 including a high pass filter for applying said first mentioned error signal to said delay device.

19. The invention as set forth in claim 17 wherein said extracting means includes a transverse decorrelation filter.

* * * * *